(12) United States Patent
Iguchi et al.

(10) Patent No.: US 8,422,299 B2
(45) Date of Patent: Apr. 16, 2013

(54) NON-VOLATILE SEMICONDUCTOR MEMORY DEVICE

(75) Inventors: Natsuki Iguchi, Tokyo (JP); Takashi Maeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 13/091,589

(22) Filed: Apr. 21, 2011

(65) Prior Publication Data

US 2012/0176836 A1 Jul. 12, 2012

(30) Foreign Application Priority Data

Jan. 7, 2011 (JP) ................................ 2011-002028

(51) Int. Cl.
*G11C 16/04* (2006.01)

(52) U.S. Cl.
USPC ............... 365/185.18; 365/185.2; 365/185.27

(58) Field of Classification Search ............. 365/185.18, 365/185.19, 185.2, 185.17, 185.11, 185.14, 365/185.27, 185.28; 438/257, 258, 264; 257/314, 316, 319
See application file for complete search history.

(56) References Cited

U.S. PATENT DOCUMENTS

| | | |
|---|---|---|
| 5,680,347 A | 10/1997 | Takeuchi et al. |
| 5,940,321 A | 8/1999 | Takeuchi et al. |
| 6,046,940 A | 4/2000 | Takeuchi et al. |
| 6,151,249 A | 11/2000 | Shirota et al. |
| 7,539,056 B2 | 5/2009 | Katsumata et al. |
| 2007/0252201 A1 | 11/2007 | Kito et al. |
| 2010/0207195 A1 | 8/2010 | Fukuzumi et al. |
| 2011/0063914 A1* | 3/2011 | Mikajiri et al. .......... 365/185.15 |
| 2011/0235421 A1* | 9/2011 | Itagaki et al. ............ 365/185.17 |

FOREIGN PATENT DOCUMENTS

| | | |
|---|---|---|
| JP | 2009-146954 | 7/2009 |
| JP | 2009-205764 | 9/2009 |

OTHER PUBLICATIONS

U.S. Appl. No. 12/846,234, filed Jul. 29, 2010, Kiyotaro Itagaki et al.
H. Tanaka et al., "Bit Cost Scalable Technology with Punch and Plug Process for Ultra High Density Flash Memory," Syposium on VLSI Technology Digest of Technical Papers, 2007, pp. 14-15.
Takashi Maeda et al., "Multi-stacked 1G cell/layer Pipe-shaped BiCS Flash Memory," Symposium on VLSI Circuits Digest of Technical Papers, 2009, pp. 22-23.

* cited by examiner

*Primary Examiner* — Tuan T Nguyen
*Assistant Examiner* — Hien Nguyen
(74) *Attorney, Agent, or Firm* — Oblon, Spivak, McClelland, Maier & Neustadt, L.L.P.

(57) ABSTRACT

According to one embodiment, a non-volatile semiconductor memory device comprises memory strings. Each memory string comprises a semiconductor layer, control gates, a first selection gate, and a second selection gate. A semiconductor layer comprises a pair of pillar portions which extend in a vertical direction to a substrate, and a coupling portion formed to couple the pair of pillar portions. Control gates orthogonally intersect one of the pair of pillar portions or the other of the pair of pillar portions. A first selection gate orthogonally intersects one of the pair of pillar portions and is formed above the control gates. A second selection gate orthogonally intersects the other of the pair of pillar portions, is formed above the control gates, and is on the same level as the first selection gate as well as integrated with the first selection gate.

14 Claims, 21 Drawing Sheets

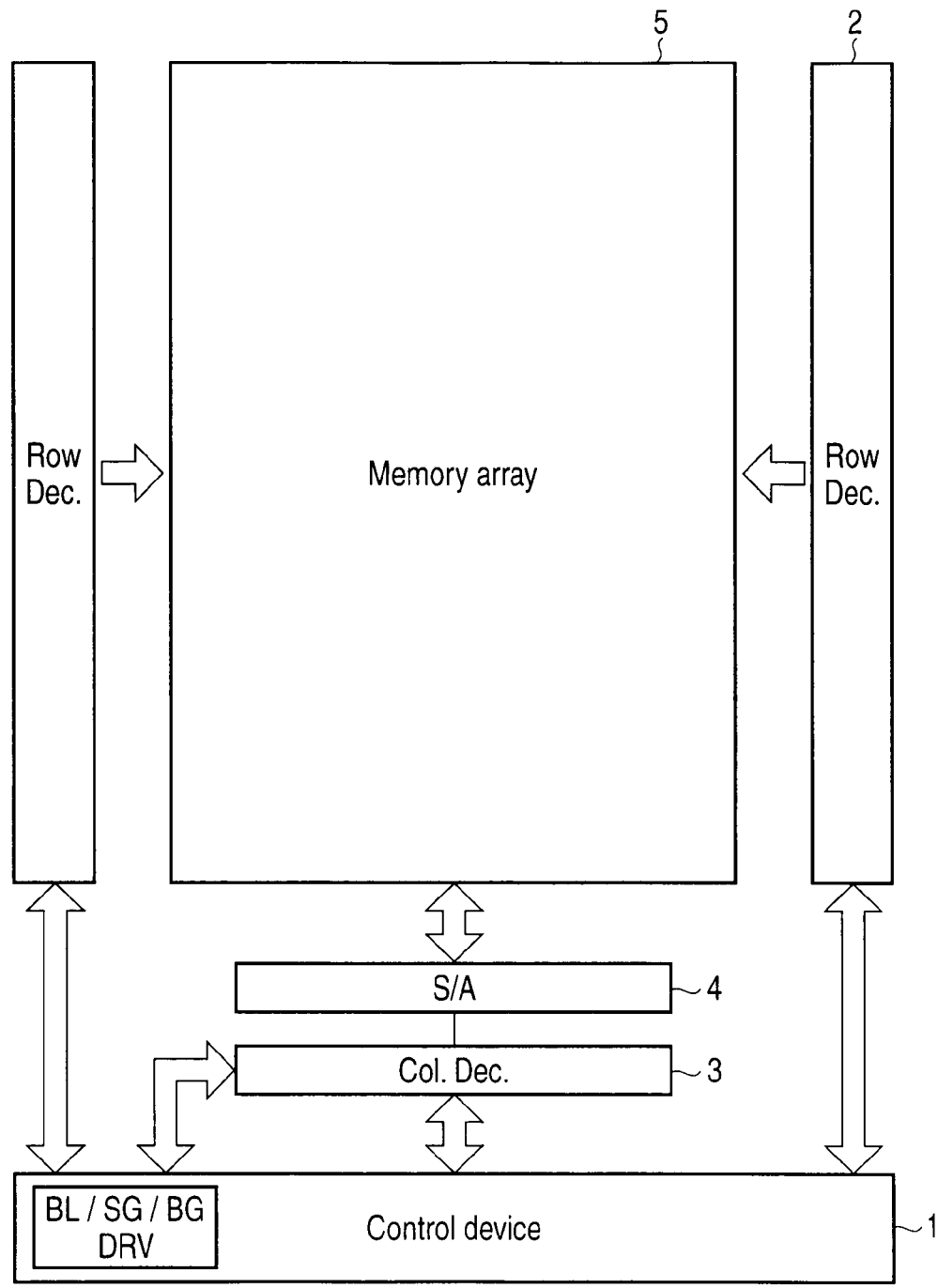
F I G. 1

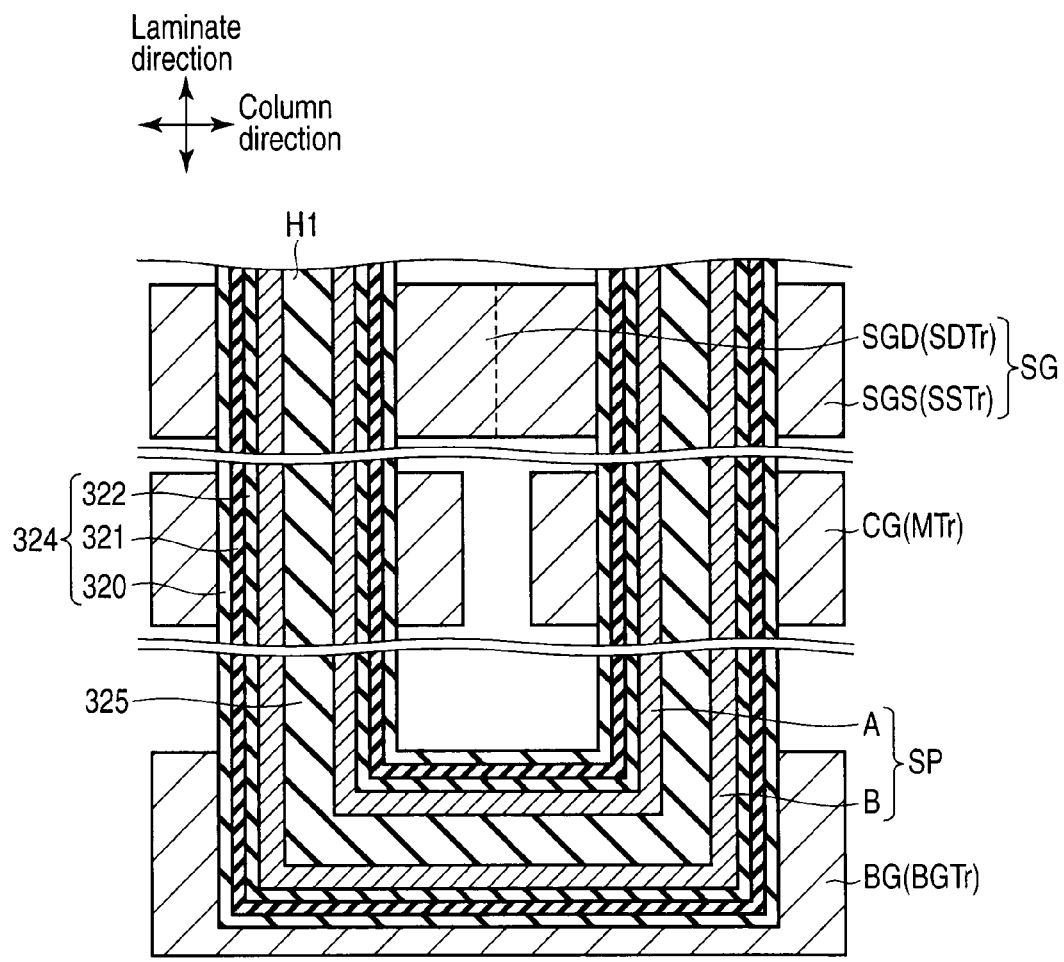
F I G. 4

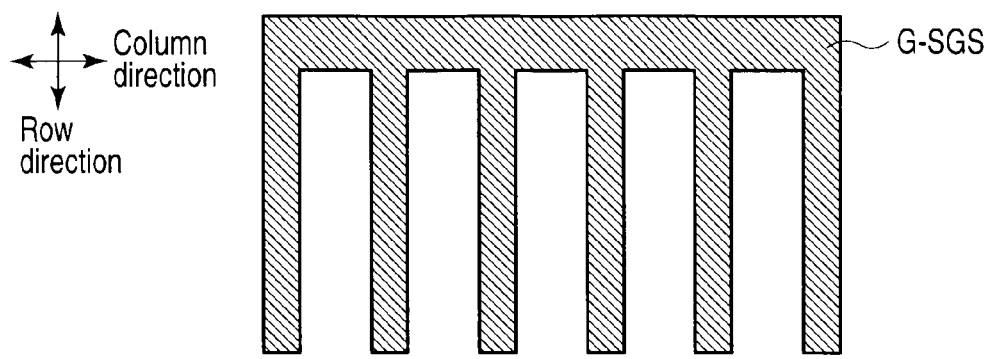
F I G. 10
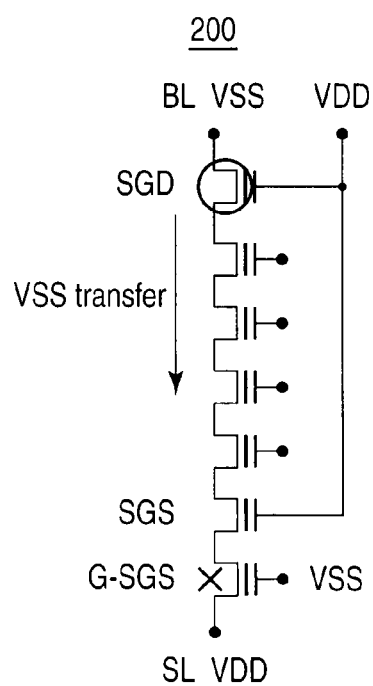
F I G. 11

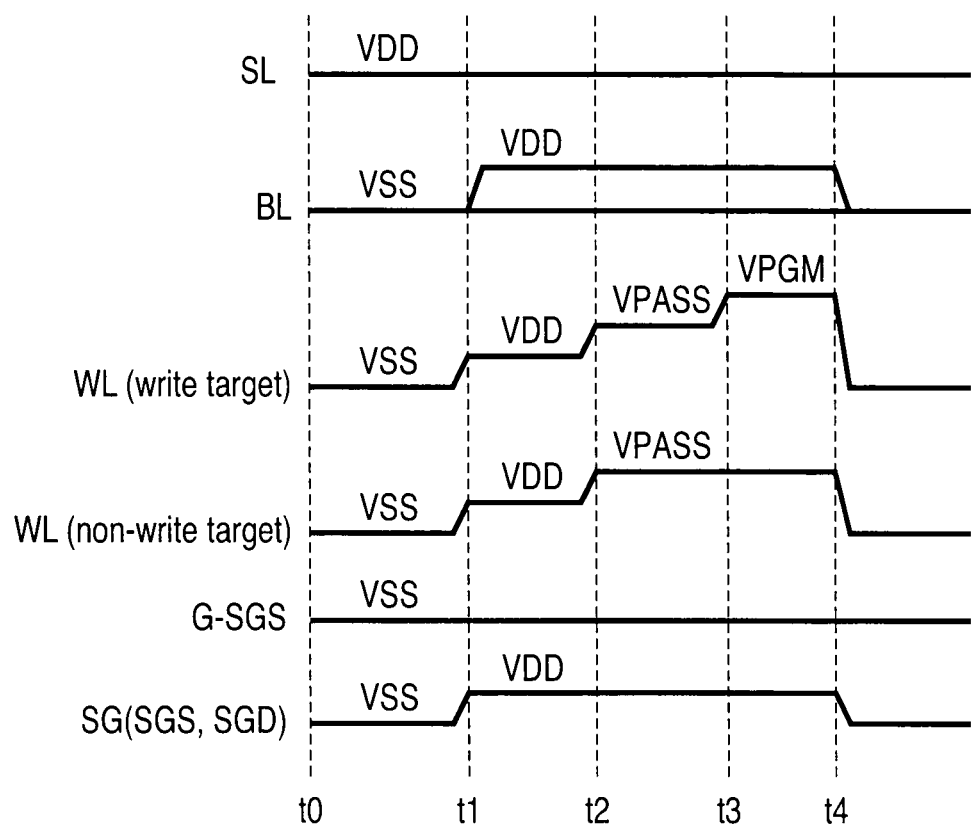
F I G. 1 2

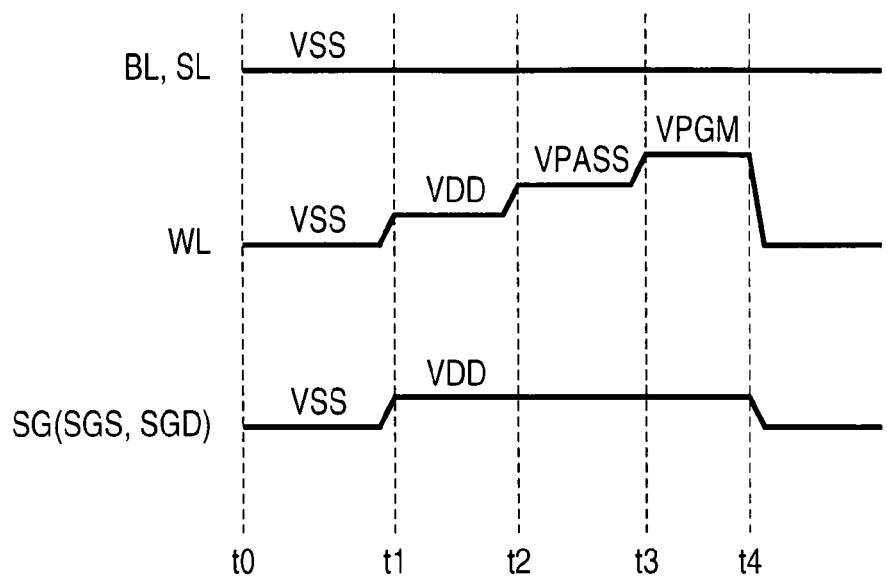
F I G. 1 6
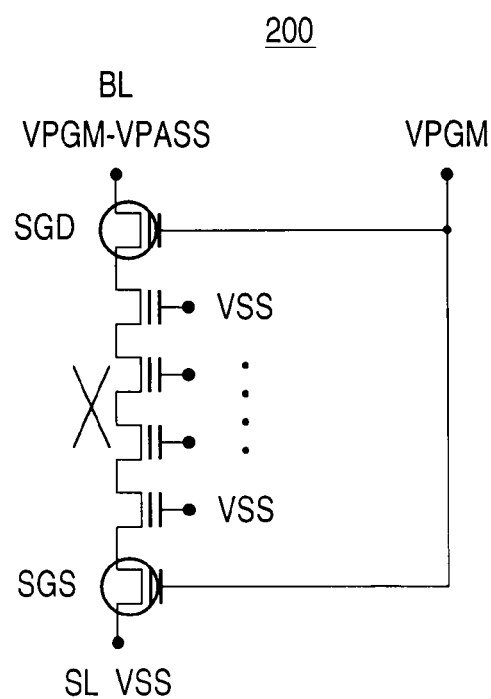
F I G. 1 7

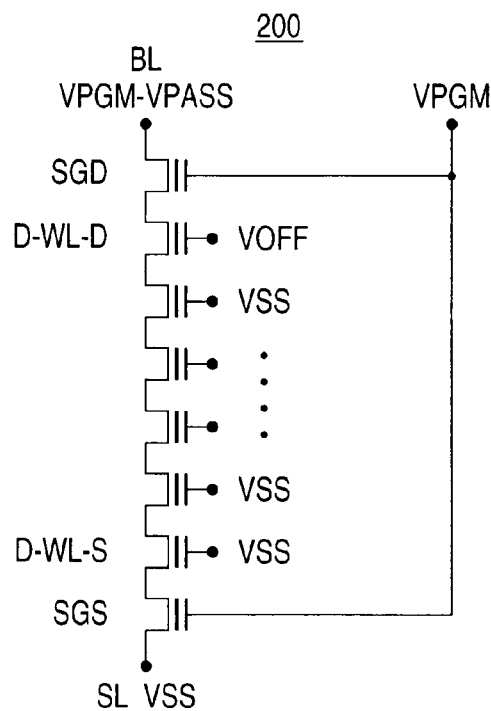
F I G. 2 2
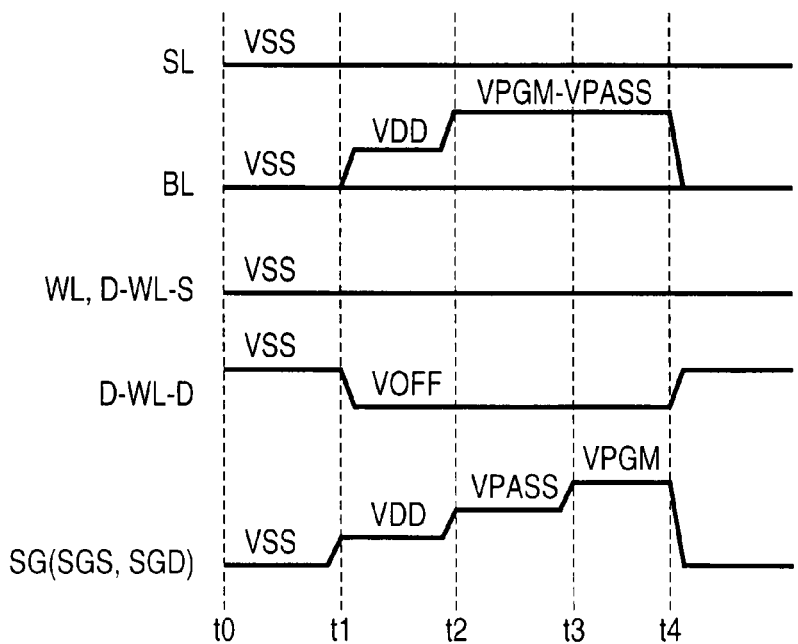
F I G. 2 3

NON-VOLATILE SEMICONDUCTOR MEMORY DEVICE

CROSS-REFERENCE TO RELATED APPLICATIONS

This application is based upon and claims the benefit of priority from Japanese Patent Application No. 2011-002028, filed Jan. 7, 2011; the entire contents of which are incorporated herein by reference.

FIELD

Embodiments described herein relate generally to a non-volatile semiconductor memory device.

BACKGROUND

In conventional LSIs, elements were configured integrally in a two-dimensional plane on a silicon substrate. Therefore, there is no way other than reducing (miniaturizing) a size of an element to increase a storage capacity of a memory. However, recently, the miniaturization becomes difficult in cost as well as technically.

To solve the problem, there is proposed an idea of manufacturing a three-dimensionally laminated memory by laminating memory layers three-dimensionally and collectively processing the memory layers. Further, there is proposed a pipe-shaped NAND type flash memory in which a U-shaped NAND string is formed in a laminate direction as the collectively-processed-type three-dimensionally laminated memory (pipe-shaped bit cost scalable (p-BiCS)). In the pipe-shaped NAND type flash memory, a NAND string is configured of a pair of silicon pillars and a pipe for coupling the silicon pillars in lower ends. More specifically, a memory cell transistor is disposed to each intersecting portion of the silicon pillars and laminated word lines. Further, at the upper ends of them, selection transistors are disposed to the respective intersecting portions of the respective ones of the pair of silicon pillars and two selection gates. One of the two selection transistors is connected to a bit line, and the other of the two selection transistors is connected to a source line.

The p-BiCS has a problem in that an increase of the number of laminated layers increases a chip area. This is because the increase of the number of laminated layers increases the number of word line drivers and the number of wirings for connecting word lines to the drivers. It is necessary to suppress an enlargement of a chip area due to the increase of number of the drivers and the wirings.

BRIEF DESCRIPTION OF THE DRAWINGS

FIG. 1 is a block diagram showing an overall configuration example of a non-volatile semiconductor memory device according to a first embodiment;

FIG. 4 is an enlarged view of a NAND string shown in FIG. 3;

FIG. 10 is a plan view showing a selection gate according to a second embodiment;

FIG. 11 is a circuit diagram showing a NAND string according to the second embodiment;

FIG. 12 is a timing chart showing voltage values when a write operation is performed to the NAND string according to the second embodiment;

FIG. 16 is a timing chart showing voltage values when a write operation is performed to a NAND string according to the third embodiment;

FIG. 17 is a circuit diagram showing a NAND string according to the third embodiment;

FIG. 22 is a circuit diagram showing a NAND string according to a modification 1 of the third embodiment;

FIG. 23 is a timing chart showing voltage values when a write operation is performed to a NAND string according to the modification 1 of the third embodiment;

DETAILED DESCRIPTION

Figure 2:
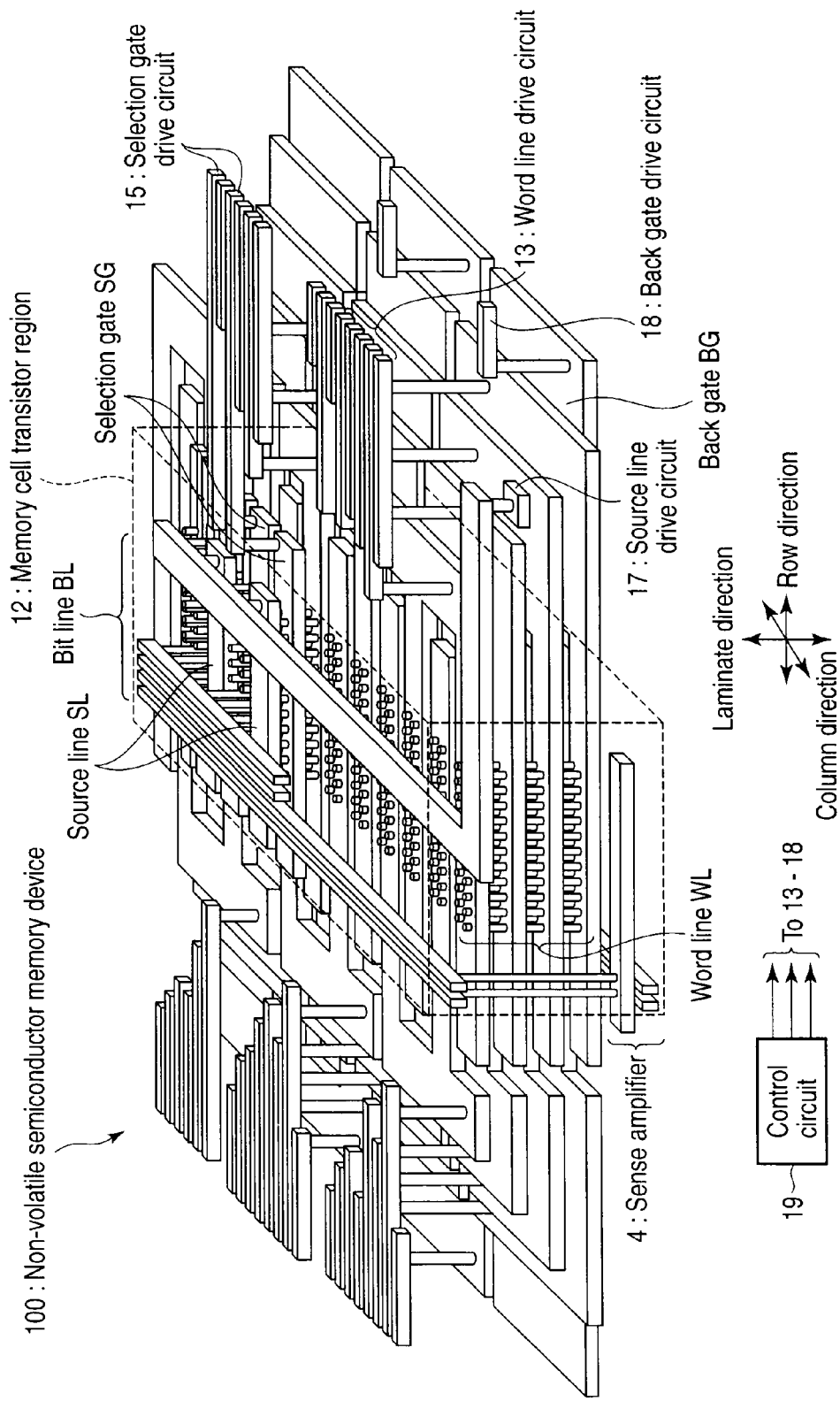
FIG. 2 is a schematic configuration view showing the non-volatile semiconductor memory device according to the first embodiment.

In general, according to one embodiment, a non-volatile semiconductor memory device comprises memory strings. Each memory string comprises: a semiconductor layer, control gates, a first selection gate, and a second selection gate. A semiconductor layer comprises a pair of pillar portions which extend in a vertical direction to a substrate, and a coupling portion formed to couple the pair of pillar portions. Control gates orthogonally intersect one of the pair of pillar portions or the other of the pair of pillar portions. A first selection gate orthogonally intersects one of the pair of pillar portions and is formed above the control gates. A second selection gate orthogonally intersects the other of the pair of pillar portions, is formed above the control gates, and is on the same level as the first selection gate as well as integrated with the first selection gate.

Embodiments will be explained below referring to the drawings. In the drawings, the same portions are denoted by the same reference symbols.

First Embodiment

A non-volatile semiconductor memory device according to a first embodiment will be explained below using FIG. 1 to FIG. 8. The first embodiment is an example of a p-BiCS, in which, in a NAND string (memory string), a drain side selection gate and a source side selection gate are on the same level as well as formed integrally, and a channel region of the source side selection transistor has a high impurity concentration.

[Structure]

A structure of the non-volatile semiconductor memory device according to the first embodiment will be explained using FIG. 1 to FIG. 4.

FIG. 1 shows a block diagram of the non-volatile semiconductor memory device according to the first embodiment.

As shown in FIG. 1, the non-volatile semiconductor memory device includes a control device 1 (drive device), a row decoder 2, a column decoder 3, a sense amplifier 4, and a memory array 5.

The control device 1 is configured to create a voltage supplied to a memory cell when data is written, erased, and read as well as to control the row decoder 2, the column decoder 3, and the sense amplifier 4 in response to an address supplied from the outside.

The row decoder 2 is configured to select a word line WL under the control of the control device 1.

The column decoder 3 is configured to select a bit line BL via the sense amplifier 4 under the control of the control device 1.

The memory array 5 includes blocks. Each of the blocks includes word lines WL and bit lines BL, and memory cells disposed in a matrix state.

The sense amplifier 4 is configured to amplify the data read out from the memory cells to the bit lines BL in each page under the control of the column decoder 3. Note that the sense amplifier 4 and the column decoder 3 may be configured integrally.

FIG. 2 shows a schematic configuration view of the non-volatile semiconductor memory device according to the first embodiment.

As shown in FIG. 2, the non-volatile semiconductor memory device 100 includes a memory cell transistor region 12, word line drive circuits 13, selection gate drive circuits 15, source line drive circuits 17, a back gate transistor drive circuit 18, and the like. A control circuit 19 includes the word line drive circuits 13, the selection gate drive circuits 15, the source line drive circuits 17, the back gate transistor drive circuit 18, and the like.

Note that the control circuit 19 in FIG. 2 is approximately synonym with the control device 1, the row decoder 2, the column decoder 3, and the sense amplifier 4 in FIG. 1, and the memory cell transistor region 12 in FIG. 2 is approximately synonym with the memory array 5 in FIG. 1. That is, as an example of the embodiment, the control circuit 19 is disposed externally of the memory cell transistor region 12 (memory array 5).

The memory cell transistor region 12 is provided with the word lines WL, the bit lines BL, source lines SL, a back gate BG, and selection gates SG. In the memory cell transistor region 12, memory cell transistors for storing data are disposed in the respective intersection positions of the laminated word lines WL and a U-shaped silicon pillar SP to be described later. Note that, although FIG. 2 shows an example in which the word lines WL are laminated to four layers, the embodiment is not limited to the four layers.

The word line drive circuits 13 are connected to the word lines WL and control a voltage applied to the word lines WL. Although all the wirings for connecting the word line drive circuits 13 to the word lines WL are formed on wiring layers on the same level, the embodiment is not limited to the configuration, and the wirings may be formed on wiring layers on a different level. Further, a not shown bit line drive circuit controls a voltage applied to the bit lines BL.

The source line drive circuits 17 are connected to the source lines SL and control a voltage applied to the source lines SL. Although the source line drive circuits 17 are connected to all the source lines SL, the embodiment is not limited to the configuration and a source line drive circuit 17 may be disposed to each source line SL.

The back gate drive circuit 18 is connected to the back gate BG and controls a voltage applied to the back gate BG.

The selection gate drive circuits 15 are connected to the selection gates SG and control a voltage applied to the selection gates SG. The selection gates SG will be described later in detail.

Figure 3:
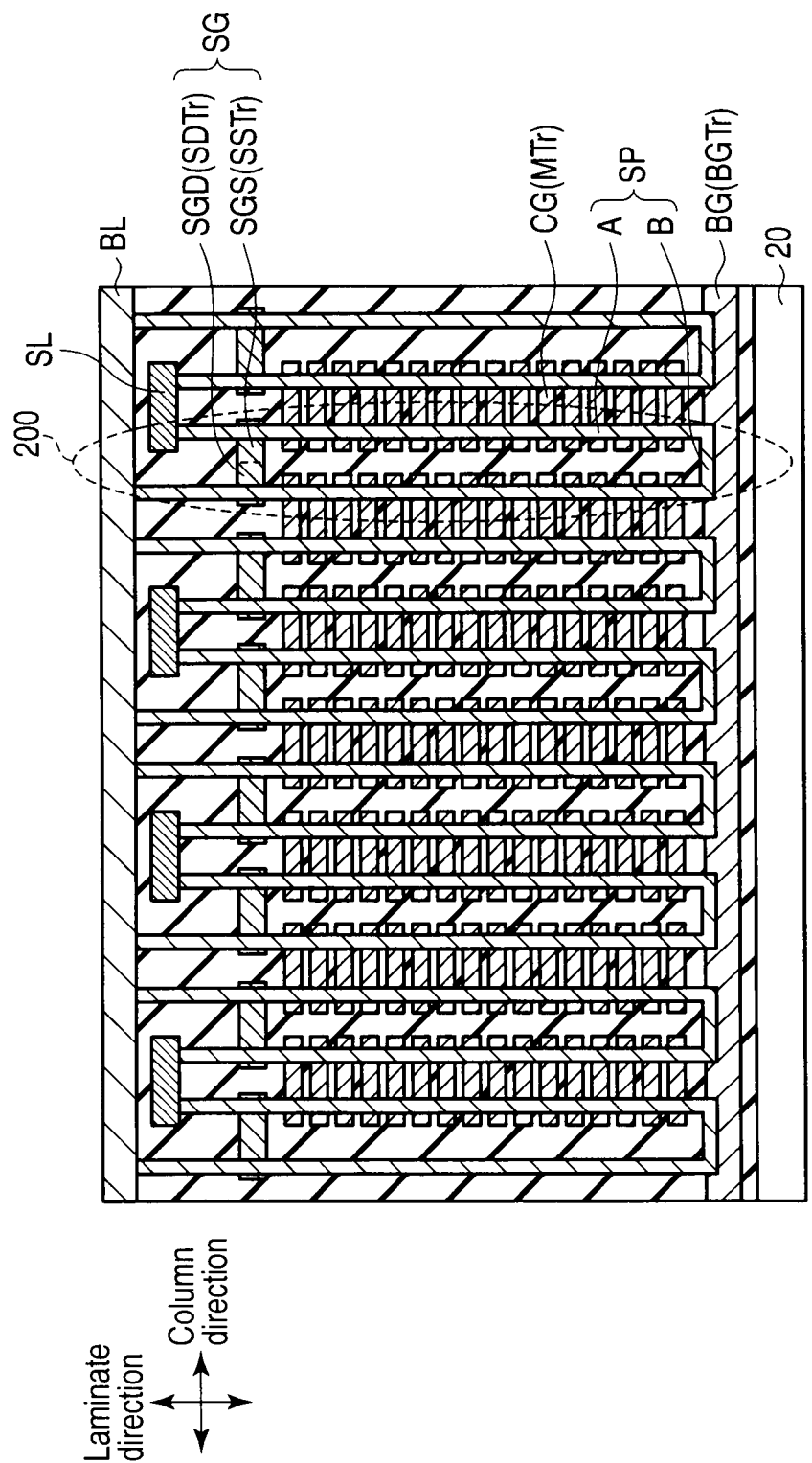
FIG. 3 is a sectional view showing a structure of the non-volatile semiconductor memory device according to the first embodiment.

FIG. 3 is a sectional view along a column direction of the memory cell transistor region 12 shown in FIG. 2 and shows a structure of the memory cell transistor region 12 in the first embodiment. FIG. 4 shows an enlarged view of the NAND string shown in FIG. 3.

As shown in FIG. 3, in the memory cell transistor region 12, the NAND strings (memory cell strings) 200, which include the U-shaped silicon pillar SP, are formed on a substrate 20. The respective NAND strings 200 include memory cell transistors MTr and two selection transistors (a drain side selection transistor SDTr and a source side selection transistor SSTr) formed to both ends of each memory transistor.

The memory cell transistors MTr are formed to the respective intersection positions of the U-shaped silicon pillar SP and control gates CG (word lines WL) and current paths are connected to the memory cell transistors MTr in series. As shown in FIG. 4, the respective memory cell transistors MTr have a memory film 324 between the U-shaped silicon pillar SP and the control gates CG. The memory film 324 includes a tunnel insulation film 322, a charge accumulation layer 321, and a block insulation film 320 sequentially formed in a periphery of the U-shaped silicon pillar SP. That is, the respective memory cell transistors MTr have a MONOS structure.

The drain side selection transistor SDTr is formed to the intersection position of the U-shaped silicon pillar SP and the drain side selection gate SGD. In contrast, the source side selection transistor SSTr is formed to the intersection position of the U-shaped silicon pillar SP and the source side selection gate SGS. As shown in FIG. 4, the drain side selection transistor SDTr and the source side selection transistor SSTr have the MONOS structure likewise the memory cell transistors MTr, respectively.

Further, the drain side selection transistor SDTr and the source side selection transistor SSTr are formed above the memory cell transistors MTr. Further, the source side selection transistor SSTr has one end connected to one ends of the memory cell transistors and the other end connected to a source line SL. In contrast, the drain side selection transistor SDTr has one end connected to the other ends of the memory cell transistors and the other end connected to a bit line BL.

The U-shaped silicon pillar SP is formed in U-shape in a cross section in the column direction. The U-shaped silicon pillar SP has a pair of pillar portions A extending in a laminate direction and a pipe portion B formed so as to cause lower ends of the pair of pillar portions A to be coupled with each other. The pipe portion B is disposed in the back gate BG and configures a back gate transistor BGTr. Further, the U-shaped silicon pillar SP is disposed such that a straight line, which connects the center axes of the pair of pillar portions A is in parallel with the column direction. The U-shaped silicon pillars SP are disposed in a matrix state in a plane configured from a row direction and the column direction. Further, as shown in FIG. 3, the U-shaped silicon pillar SP has a hollow H1 filled with an insulating portion 325.

The control gates CG are laminated above the back gate BG and disposed so as to be orthogonal to a pillar portion C of the U-shaped silicon pillar SP. The respective control gates CG extend in parallel in the row direction. Further, the respective control gates CG are formed so as to be shared by two adjacent pillar portions A in a U-shaped silicon pillar SP in two NAND strings 200 which are adjacent in the column direction.

Note that, although FIG. 3 shows an example in which the control gates CG are laminated to 16 layers, the embodiment is not limited to the 16 layers. Further, although not shown, odd-number-th control gates CG are configured as a unit at one ends in the column direction in the row direction in each block. In contrast, even-number-th control gates CG are configured as a unit at the other ends in the column direction in the row direction in each block.

The back gate BG is disposed below a lowermost of the word line WL. The back gate BG is formed to two-dimensionally expand in the row direction and the column direction so as to cover the pipe portion B of the U-shaped silicon pillar SP.

The drain side selection gate SGD and the source side selection gates SGS are disposed on an uppermost control gate CG. The drain side selection gate SGD and the source side selection gate SGS extend in parallel in the row direction. Further, the drain side selection gate SGD and the source side selection gate SGS are formed to intersect the respective pillar portions A of the U-shaped silicon pillar SP, insulated and separated from each other in the column direction, and formed in-line-and-space shape.

The drain side selection gate SGD and the source side selection gate SGS in the embodiment are formed as a selection gate SG in each NAND string 200. In other words, the drain side selection gate SGD and the source side selection gate SGS are disposed on the same level in each NAND string 200 and configured integrally. Further, as shown in FIG. 2, one selection gate drive circuit 15 is connected to one selection gate SG (drain side selection gate SGD and source side selection gate SGS).

The source lines SL are disposed above the selection gates SG. The source lines SL are formed so as to be shared by two adjacent pillar portions A of the U-shaped silicon pillar SP in two NAND strings 20 which are adjacent in the column direction. The source lines SL extend in parallel in the row direction, insulated and separated from each other in the column direction, and formed in-line-and-space shape.

The bit lines BL are disposed above the source lines SL. The bit lines BL extend in the column direction, are insulated and separated from each other in the row direction, and formed in-line-and-space shape.

[Write Method]

A write method of the non-volatile semiconductor memory device according to the first embodiment will be explained using FIGS. 5A and 5B and FIGS. 6A and 6B.

Figures 5A, 5B:
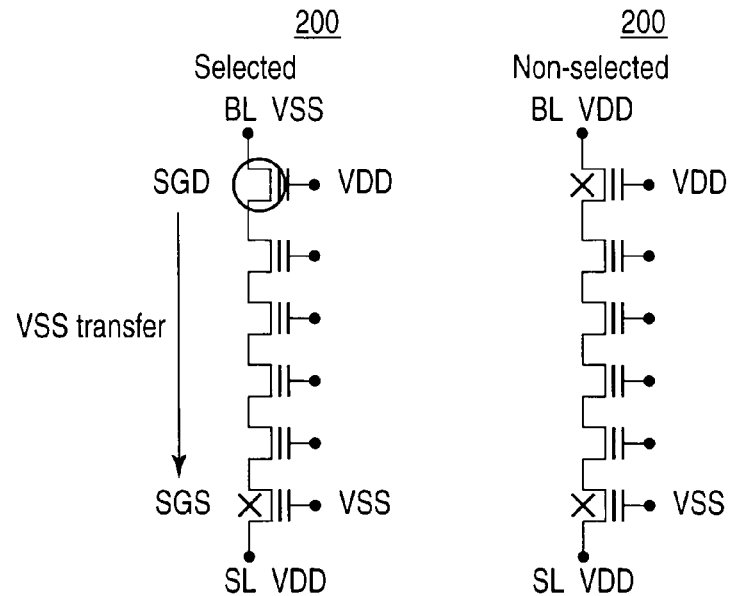
FIG. 5A is a circuit diagram showing a comparative example of a NAND string relating to the first embodiment.
FIG. 5B is a circuit diagram showing a comparative example of a NAND string relating to the first embodiment.
Figures 6A, 6B:
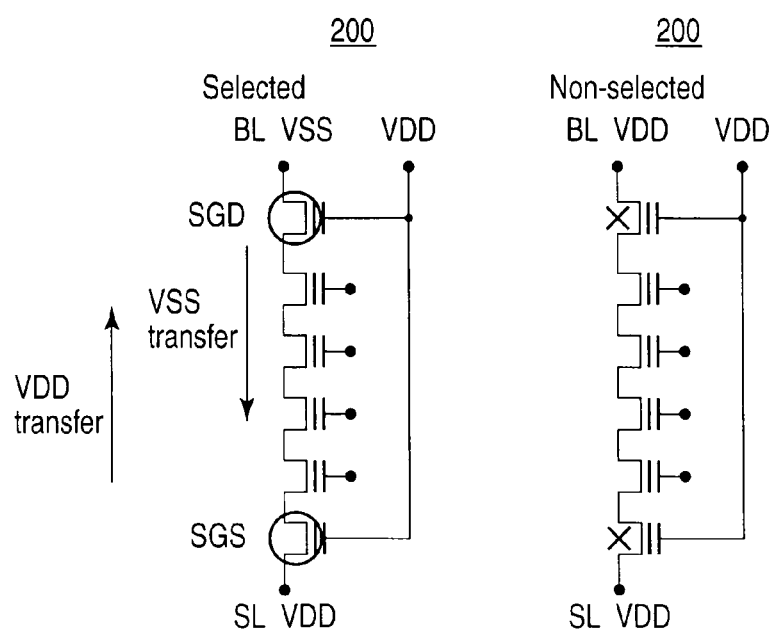
FIG. 6A is circuit diagram showing a NAND string according to the first embodiment.
FIG. 6B is circuit diagram showing a NAND string according to the first embodiment.

FIG. 5A and FIG. 5B show a circuit diagram when data is ordinarily written to a NAND string, and the circuit diagram is a comparative example to a circuit diagram when the write operation is performed to the NAND string 200 according to the first embodiment. FIG. 6A and FIG. 6B show the circuit diagram of the NAND strings 200 according to the first embodiment in write operation.

As shown in FIG. 5A and FIG. 5B, according to the ordinary write method, a different voltage is applied to a source side selection gate SGS and a drain side selection gate SGD.

More specifically, as shown in FIG. 5A, in a selected NAND string 200, a voltage VSS (for example, 0 V) is applied to a bit line BL, and a voltage VDD (for example, 3 V) is applied to a source line SL. Further, the voltage VSS (for example, 0 V) is applied to a source side selection gate SGS, and the voltage VDD (for example, 3 V) is applied to a drain side selection gate SGD. Further, although not shown, a conduction voltage is applied to a back gate BG.

Further, a write voltage VPGM (for example, 18 V) is applied to a word line WL of a write target memory cell transistor MTr in the selected NAND string 200, and a write pass voltage VPASS (for example, 10 V) is applied to a word line WL of a write target memory cell MTr.

As described above, the drain side selection gate SGD is turned on by applying the voltage VSS to the bit line BL and applying the voltage VDD to the drain side selection gate SGD so that the voltage VSS is transferred to a channel. In contrast, the source side selection gate SGS is turned off by applying the voltage VDD to the source line SL and applying the voltage VSS to the source side selection gate SGS so that the voltage VDD is not transferred to the channel. With the operation, data can be written to the selected NAND string 200.

In contrast, as shown in FIG. 5B, in a non-selected NAND string 200, the voltage VDD is applied to the bit line BL, and the same voltages as the selected NAND string 200 are applied to the source line SL, the source side selection gate SGS, and the drain side selection gate SGD. Application of the voltage VDD to the bit line BL makes a potential of the drain side selection gate SGD and a potential of the bit line BL to the same potential. As a result, since the drain side selection gate SGD is turned off and a potential difference is reduced between the channel of the memory cell transistor MTr and the control gate CG, write to the memory transistor MTr is not performed.

However, when the write method is applied to the first embodiment, the following problem will arise.

As shown in FIG. 6A and FIG. 6B, in the first embodiment, since the drain side selection gate SGD and the source side selection gate SGS are configured integrally, the same voltage is applied to the drain side selection gate SGD and the source side selection gate SGS. That is, as shown in FIG. 6A, in a selected NAND string 200, when the voltage VDD is applied to selection gates SG (drain side selection gate SGD and source side selection gate SGS), the source side selection gate SGS is also turned on by the voltage VSS transferred from a bit line BL to a channel. Therefore, since the voltage VDD applied to the source line SL is transferred to the channel, a write operation becomes inadequate.

To cope with the inadequate write operation, in the first embodiment, the impurity concentration of a channel region of the source side selection gate SGS (source side selection transistor SSTr) is made larger than the impurity concentration of a channel region of the drain side selection gate SGD (drain side selection transistor SDTr). More specifically, the impurity concentration of the channel region of the drain side selection transistor SDTr is about $5 \times 10^{14}$ cm$^{-2}$, whereas the impurity concentration of the channel region of the source side selection transistor SSTr is about $1 \times 10^{15}$ cm$^{-2}$-$5 \times 10^{15}$ cm$^{-2}$.

As a result, only the threshold value voltage of the source side selection gate SGS can be made equal to or larger than the voltage VDD. That is, in the selected NAND string 200, even if the same voltage VDD is applied to the source side selection gate SGS and the drain side selection gate SGD, the source side selection gate SGS can be turned off and only the drain side selection gate SGD can be turned on. Accordingly, in the structure, in which the source side selection gate SGS and the drain side selection gate SGD are configured integrally, an ordinary write operation can be performed to the write target memory cell transistors MTr.

[Manufacturing Method]

A method of manufacturing the non-volatile semiconductor memory device according to the first embodiment will be explained using FIG. 7. Note that, since the methods of manufacturing the back gate BG, the control gates CG, the selection gate SG, and the U-shaped silicon pillar SP are well known, the explanation of the methods is omitted. Here, an ion implantation method to the channel region of the source side selection transistor SSTr will be mainly explained.

Figure 7:
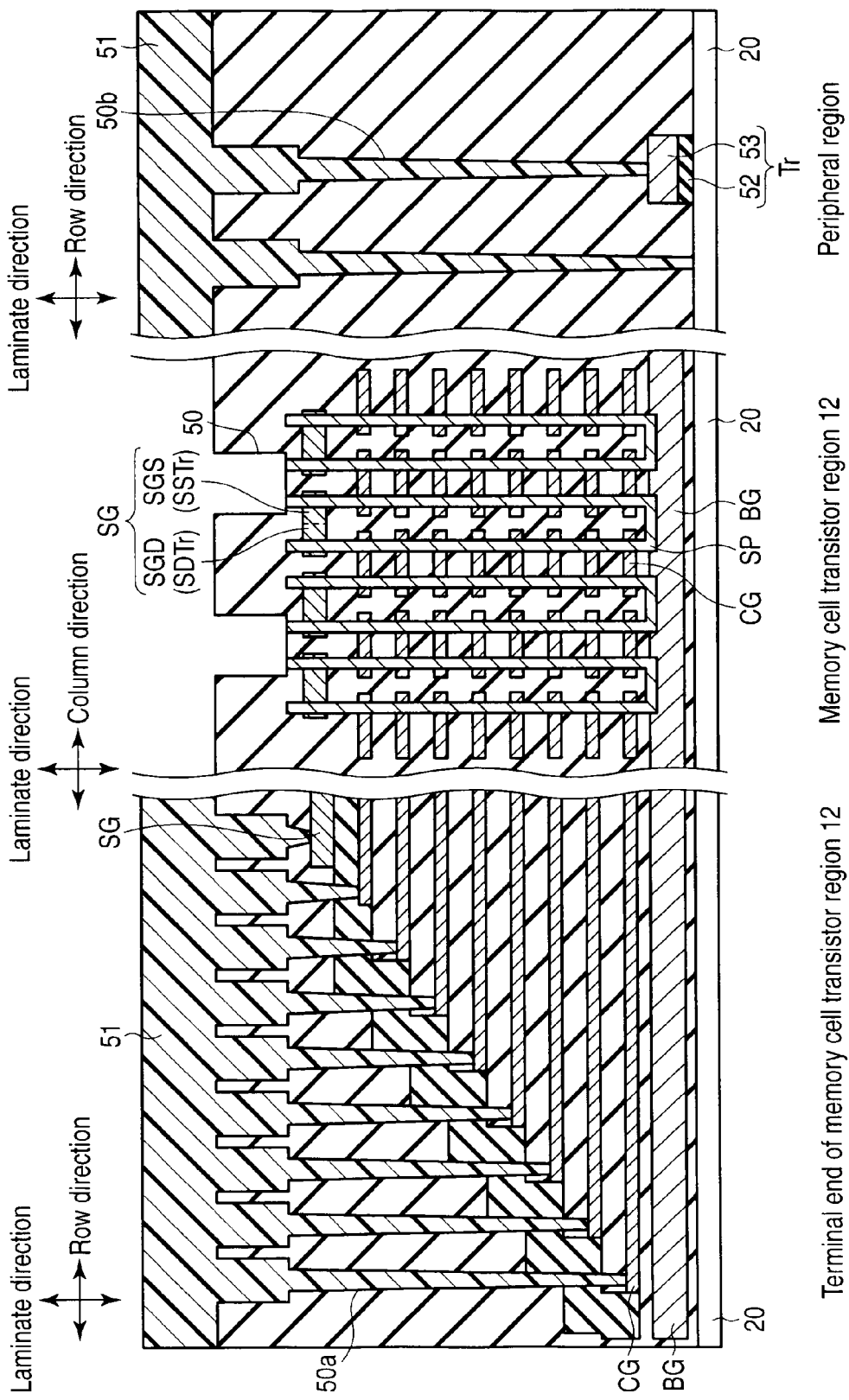
FIG. 7 is a sectional view showing manufacturing steps of the non-volatile semiconductor memory device according to the first embodiment.

FIG. 7 shows a sectional view of manufacturing steps of the non-volatile semiconductor memory device according to the first embodiment.

As shown in FIG. 7, in the memory cell transistor region 12, the back gate BG, the control gates CG, the selection gates SG (drain side selection gate SGD and source side selection gate SGS), and the U-shaped silicon pillar SP are formed on the substrate 20, and, after they are covered with an insulation film, holes 50 are formed to an insulation film above the source side selection gate SGS. The holes 50 are formed with the source lines SL later. The channel region of the source side selection transistor SSTr is exposed by forming the holes 50.

Simultaneously with the formation of the holes 50, contact holes 50a is formed at a terminal end of the memory cell transistor region 12 to form contacts connected to the control gates CG. Further, simultaneously with the formation of the holes 50, contact holes 50b are formed to form contacts connected to the respective portions of a transistor Tr (a gate insulation film 52 and a gate electrode 53) in a peripheral region.

Next, a PEP (Photolithography Etching Process) for ion implantation is performed only to the channel region of the source side selection transistor SSTr. More specifically, first, a resist 51 is applied to an entire surface of the channel region. With the operation, the holes 50 in the memory cell transistor region 12, the contact holes 50a at the terminal end of the memory cell transistor region 12, and the contact holes 50b in the peripheral region are filled with the resist 51. Thereafter, the resist 51 formed to the memory cell transistor region 12 is removed. With the operation, the channel region of the source side selection transistor SSTr in the holes 50 is exposed.

When the resist 51 is removed, a lithography step is performed between the memory cell transistor region 12 and the terminal end and the peripheral region of the memory cell transistor region 12. That is, since the lithography step is performed between the relatively large regions, the lithography step may be performed using not only an ArF laser beam having high accuracy but also using an I-beam whose accuracy is lower than the ArF laser beam.

Next, a high acceleration ion implantation is performed to the exposed channel region of the source side selection transistor SSTr. With the operation, the impurity concentration of the channel region of the source side selection transistor SSTr is made higher than the impurity concentration of the channel region of the drain side selection transistor SDTr. Thereafter, to stabilize impurity ions, it is preferable to perform a heat treatment.

Next, the resist 51, which is formed to the terminal end and the peripheral region of the memory cell transistor region 12, is removed, and the contact holes 50a and 50b are opened. Thereafter, the source lines SL are formed by a known technology and the contact holes 50a and 50b are filled with a conductive material at the same time. Since subsequent steps are well known, the steps are omitted.

[Effect]

According to the first embodiment, in a NAND string 200, the drain side selection gate SGD and the source side selection gate SGS are formed on the same level and configured integrally. That is, one NAND string 200 is provided with the drain side selection gate SGD and the source side selection gate SGS as one selection gate SG. With the configuration, the number of the selection gates SG in the memory cell transistor region 12 can be reduced (to one half). Accordingly, since the number of the selection gate drive circuits 15 in the peripheral region, which drive the selection gates SG, can be also reduced, the number of wirings for connecting the selection gate drive circuits 15 can be also reduced. As a result, an increase of a chip area increased by an increase of the number of laminated layers can be suppressed.

Incidentally, ordinarily, the collectively-processed-type three-dimensionally laminated memory has a problem in that since a selection gate includes polysilicon, a resistance becomes very high. Further, according to a comparative example with the embodiment shown in FIG. 8A, when a drain side selection gate and a source side selection gate separately exist, a silicon pillar is buried in a central portion of the drain side selection gate and the source side selection gate. Therefore, a conductive portion is made thin and a current path is formed substantially only to an end portion of each selection gate. As a result, the resistance of the selection gates is more increased. Accordingly, since the selection gates have a large resistance value, a problem arises in that an operation speed of a circuit is lowered.

To solve the problem, although it is proposed to lower the resistance by composing the selection gates of silicide, the number of processes is increased and the resistance is not so lowered by impurities mixed in the selection gates, and the like. Further, even if it is intended to lower the resistance of the selection gates by dividing a cell array, the chip area is greatly increased by an increase of a transfer area caused by dividing the cell array.

Figure 8A:
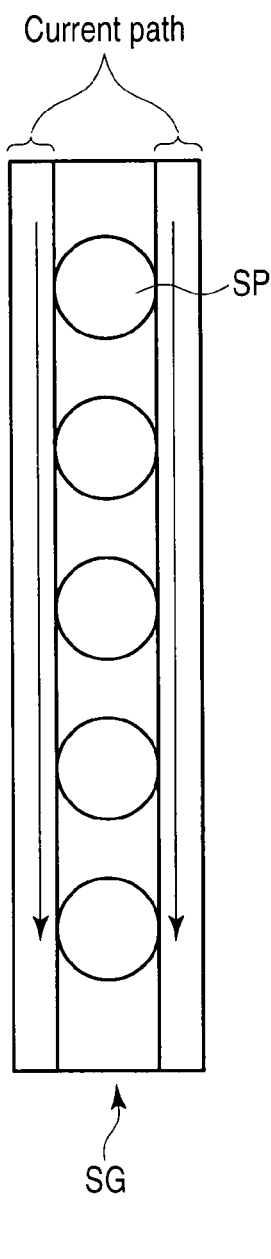
FIG. 8A is a plan view showing a comparative example of a selection gate relating to the first embodiment.
Figure 8B:
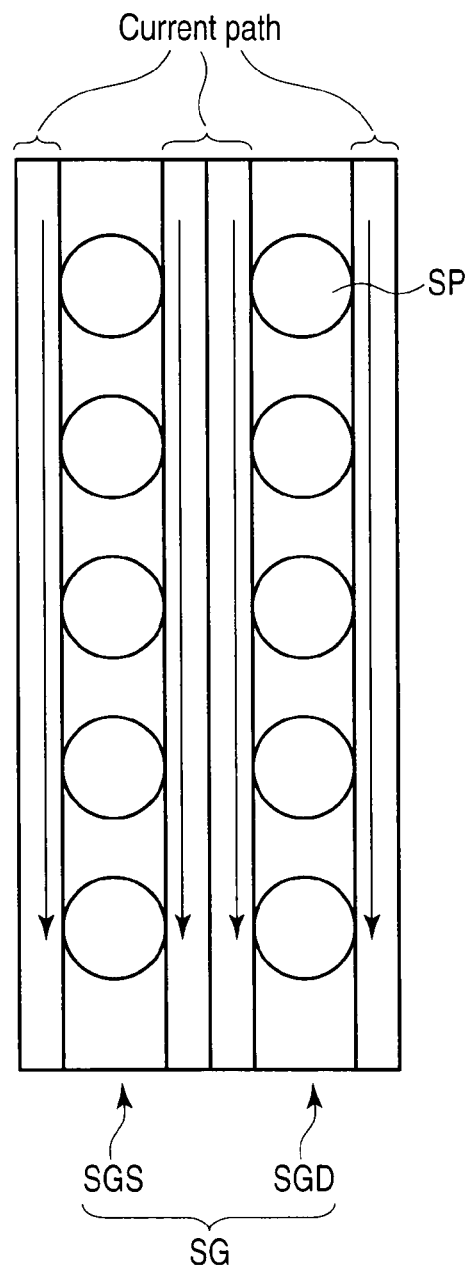
FIG. 8B is a plan view showing a selection gate according to the first embodiment.

In contrast, as shown in FIG. 8B, according to the embodiment, the drain side selection gate SGD and the source side selection gate SGS are configured integrally and formed so as to be shared by two adjacent pillar portions A in the U-shaped silicon pillars SP. With the configuration, since the area of the current path can be increased, the resistance of the selection gate SG can be reduced. As a result, the operation speed of the circuit can be improved.

Second Embodiment

A non-volatile semiconductor memory device according to a second embodiment will be explained below using FIG. 9 to FIG. 12. The second embodiment is an example of a collectively-processed-type three-dimensionally laminated memory, in which, in a NAND string, a drain side selection gate and a source side selection gate are formed on the same level as well as configured integrally, and further a new global source side selection gate is interposed between the source side selection gate (source side selection transistor) and a source line.

Note that, in the second embodiment, the explanation of the same point as the first embodiment is omitted and different points will be explained.

[Structure]

A structure of the non-volatile semiconductor memory device according to the second embodiment will be explained using FIG. 9 and FIG. 10.

Figure 9:
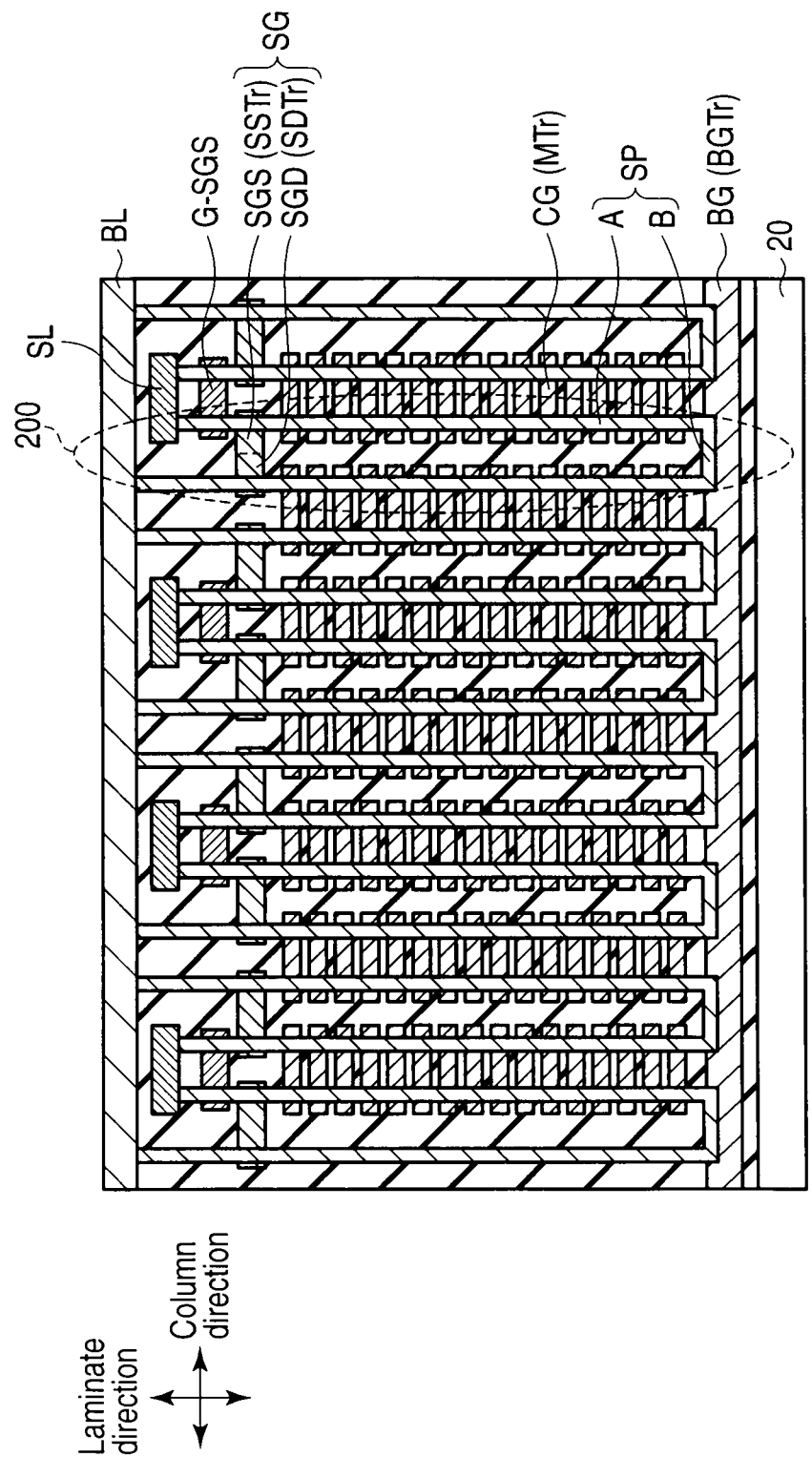
FIG. 9 is a sectional view showing a structure of a non-volatile semiconductor memory device according to a second embodiment.

FIG. 9 is a sectional view showing the memory cell transistor region 12 shown in FIG. 2 along the column direction and shows a structure of a memory cell transistor region 12 in the second embodiment.

As shown in FIG. 9, a non-volatile semiconductor memory device 100 in the second embodiment is different from the first embodiment in that a global source side selection gate G-SGS is interposed between a source side selection gate SGS and a source line SL. In other words, the source side selection gate G-SGS is formed above the source side selection gate SGS and below the source line SL. Further, the source side selection gate G-SGS is formed so as to be shared by two adjacent pillar portions A in the U-shaped silicon pillars SP in two NAND strings 200 which extend in parallel in a row direction and are adjacent in a column direction.

FIG. 10 shows a plan view of the source side selection gate G-SGS.

As shown in FIG. 10, the respective pieces of the source side selection gate G-SGS are configured as a unit at one ends in the row direction in respective blocks. In other words, all the pieces of the source side selection gate G-SGS in the respective blocks are electrically connected to each other and connected to a not shown source side selection gate drive circuit. That is, the respective pieces of the source side selection gate G-SGS alternately have the same structure as an adjacent control gate CG (for example, an odd-number-th control gate CG in the column direction), and all the pieces of the source side selection gate G-SGS in the respective blocks are controlled by a source side selection gate drive circuit.

Note that each one of the source side selection gate may be formed to a pillar portion A of a U-shaped silicon pillar SP without being shared by two adjacent pillar portions A in the U-shaped silicon pillars SP in two NAND strings 200 which are adjacent in the column direction.

[Write Method]

A write method of the non-volatile semiconductor memory device according to the second embodiment will be explained using FIG. 11 and FIG. 12.

FIG. 11 shows a circuit diagram of the NAND string 200 according to the second embodiment when data is written to the NAND string 200.

As shown in FIG. 11, in the second embodiment, since a drain side selection gate SGD and the source side selection gate SGS are configured integrally, the same voltage is applied to the drain side selection gate SGD and the source side selection gate SGS. As a result, a write operation becomes inadequate.

To cope with the inadequate write operation, in the second embodiment, the global source side selection gate G-SGS is interposed between the source side selection gate SGS and the source line SL. In a selected NAND string 200, when the voltage VSS is applied to the source side selection gate G-SGS and turns off the source side selection gate G-SGS, the voltage VDD applied to the source line SL is prevented from being transferred to a channel.

With the operation, even if the same voltage is applied to the source side selection gate SGS and the drain side selection gate SGD and both the source side selection gate SGS and the drain side selection gate SGD are turned on, data can be ordinarily written to write target memory cell transistors MTr.

FIG. 12 shows a timing chart of the voltage values applied when the write operation is performed to the NAND string 200 according to the second embodiment.

As shown in FIG. 12, at a time t0, the write operation is started. First, at the time t0, the voltage VDD is applied to the source line SL, and the voltage VSS is applied to a bit line BL, a write target word line WL, a non-write target word line WL, the source side selection gate G-SGS, and a selection gate SG (drain side selection gate SGD, and source side selection gates SGS).

Next, at a time t1, the voltage VDD is applied to the selection gate SG. At the same time, the voltage VDD is applied to the write target word line WL and to the non-write target word line WL. Further, the voltage VDD is applied to the bit line BL connected to a non-selected NAND string 200.

Next, at a time t2, the write pass voltage VPASS is applied to the write target word line WL and to the non-write target word line WL, and thereafter, at time t3, the write voltage VPGM is applied to the write target word line WL. As described above, the write operation is performed to the memory cell transistors MTr connected to the write target word line WL.

Thereafter, at a time t4, the voltage VSS is applied to the bit line BL, the write target word line WL, the non-write target word line WL, and the selection gate SG, and the write operation is finished.

Note that, although the voltages applied to the respective nodes are increased stepwise at the times t1, t2, and t3 to prevent an increase of potential due to coupling, the voltages may be increased at the same time.

[Effect]

According to the second embodiment, the same effect as the first embodiment can be obtained.

Further, in the second embodiment, the global source side selection gate G-SGS is interposed between the source side selection gate SGS and the source line SL in the respective blocks. With the configuration, the inadequate write operation, which is caused by integrally configuring the drain side selection gate SGD and the source side selection gate SGS in the NAND string 200, can be overcome without changing the threshold value voltage of the drain side selection gate SGD and the threshold value voltage of the source side selection gate SGS as in the first embodiment.

Further, the source side selection gate drive circuit for controlling the source side selection gate G-SGS is disposed independently of a selection gate line drive circuit 15 for controlling the drain side selection gate SGD and the source side selection gate SGS. With the configuration, the source side selection gate G-SGS can be controlled easily, and can the on/off characteristics of the source side selection gate can be improved as compared with the first embodiment Further, the respective pieces of the source side selection gate G-SGS are configured as a unit in the respective blocks and connected to the source side selection gate drive circuit. That is, since the number of source side selection gate drive circuits and the number of wirings can be minimized in a peripheral region, an increase of a chip area can be suppressed.

[Modification]

A structure of a non-volatile semiconductor memory device according to a modification of the second embodiment will be explained using FIG. 13 and FIG. 14.

Note that, in the modification, the explanation of the same point as the second embodiment is omitted and a different point will be explained.

Figure 13:
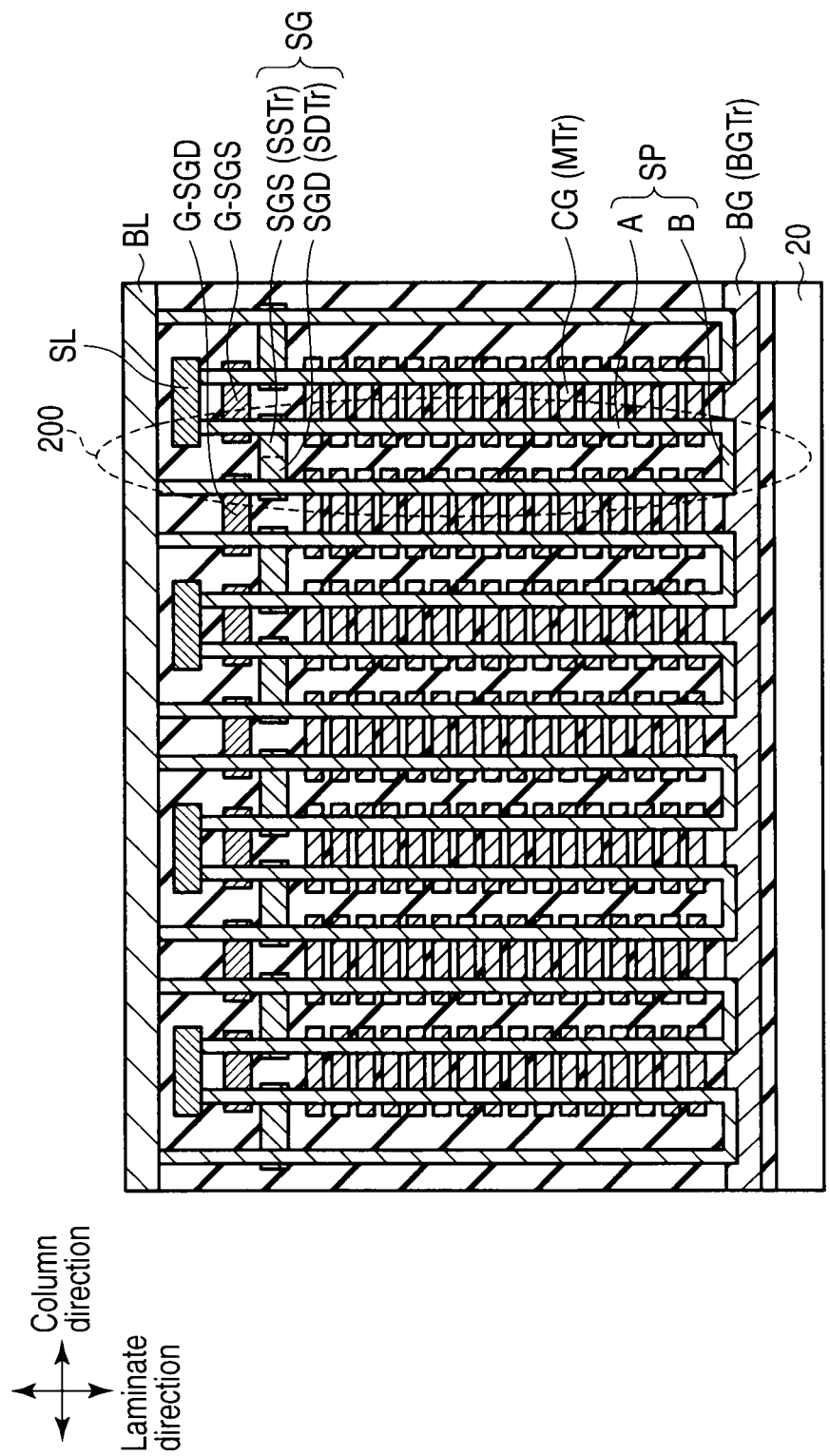
FIG. 13 is a sectional view showing a structure of a non-volatile semiconductor memory device according to a modification of the second embodiment.

FIG. 13 is a sectional view of the memory cell transistor region 12 shown in FIG. 1 along the column direction and shows a structure of a memory cell transistor region 12 in the modification of the second embodiment.

As shown in FIG. 13, in the modification, the point different from the second embodiment resides in that a global drain side selection gate G-SGD is interposed between a drain side selection gate SGD and a bit line BL. That is, not only a global selection side selection gate G-SGS is interposed between a source side selection gate SGS and a source line SL but the drain side selection gate SGD is interposed between the drain side selection gate SGD and the bit line BL. In other words, the drain side selection gate G-SGD is formed above the drain side selection gate SGD and below the bit lines BL. Further, the drain side selection gate G-SGD is formed so as to be shared by two adjacent pillar portions A in the U-shaped silicon pillars SP in two NAND strings 200 which extend in parallel in the row direction and are adjacent in the column direction.

Figure 14:
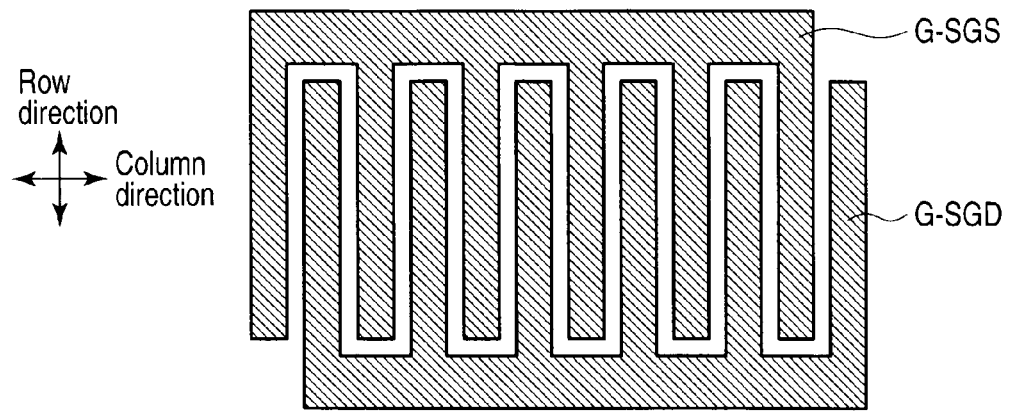
FIG. 14 is a plan view showing a selection gate according to the modification of the second embodiment.

FIG. 14 shows a plan view of the source side selection gate G-SGS and the drain side selection gate G-SGD.

As shown in FIG. 14, the respective pieces of the source side selection gate G-SGS are configured as a unit at one end in the row direction in respective blocks. In other words, all the pieces of the source side selection gate G-SGS in the blocks are electrically connected to each other and connected to a not shown source side selection gate drive circuit.

In contrast, the respective pieces of the drain side selection gates G-SGD are configured as a unit at the other ends (on a side opposite to the side where the respective pieces of the source side selection gate G-SGS are configured as the unit) in the respective blocks. In other words, all the pieces of the drain side selection gate G-SGD in the respective blocks are electrically connected to each other and connected to a not shown drain side selection gate drive circuit.

That is, the respective pieces of the source side selection gates G-SGS have, for example, the same structure as an odd-number-th control gate CG in the column direction, and the respective pieces of the drain side selection gate G-SGD have, for example, the same structure as an even-number-th control gate CG in the column direction. Further, all the pieces of the source side selection gate G-SGS in the blocks are controlled by the source side selection gate drive circuit, and all the drain side selection gates G-SGD in the blocks are controlled by the drain side selection gate drive circuit.

Note that each one of the source side selection gate G-SGS and the drain side selection gate G-SGD may be formed to a pillar portion A of a U-shaped silicon pillar SP without being shared by two adjacent pillar portions A in the U-shaped silicon pillars SP in two NAND strings 20 which are adjacent in the column direction.

According to the modification, the drain side selection gate G-SGD is formed independently of the drain side selection gate SGD and the source side selection gate SGS likewise the source side selection gate G-SGS. As a result, not only the on/off characteristics of the source side selection gate but also the on/off characteristics of the drain side selection gate can be improved in comparison with the first embodiment.

Third Embodiment

A non-volatile semiconductor memory device according to a third embodiment will be explained below using FIG. 15 to FIG. 21. The third embodiment is an example of a collectively-processed-type three-dimensionally laminated memory, in which, in a NAND string, a drain side selection gate and a source side selection gate are formed on the same level as well as configured integrally, and further, to make it possible to write data to memory cell transistors, only the threshold value voltage of the source side selection transistor is increased by performing write to a source side selection transistor before write to the memory cell transistors is performed.

Note that, in the third embodiment, the explanation of the same point as the first embodiment is omitted and only different points will be explained.

[Structure]

A non-volatile semiconductor memory device 100 in the third embodiment has the same structure as the first embodiment. That is, the non-volatile semiconductor memory device 100 includes NAND strings 200 including a U-shaped silicon pillar SP formed on a substrate 20, and each of the NAND strings 200 includes memory cell transistors MTr, two selection transistors (a drain side selection transistor SDTr and a source side selection transistor SSTr), and a back gate transistor BGTr. Further, in the NAND strings, the drain side selection gate and the source side selection gate are formed on the same level as well as configured integrally.

In particular, as shown in FIG. 3, in the third embodiment, each of the drain side selection transistor SDTr and the source side selection transistor SSTr includes a charge accumulation layer 321 between the U-shaped silicon pillar SP and a drain side selection gate SGD and between the U-shaped silicon pillar SP and a source side selection gate SGS and has the MONOS structure. That is, the drain side selection transistor SDTr and the source side selection transistor SSTr in the embodiment have the same function as the memory cell transistors MTr, and a write operation and an erase operation can be performed to the drain side selection transistor SDTr and the source side selection transistor SSTr.

Note that, in the third embodiment, although it is preferable that the impurity concentration of a channel region of the source side selection gate SGS (source side selection transistor SSTr) is larger than the impurity concentration of a channel region of the drain side selection gate SGD (drain side selection transistor SDTr), the third embodiment is not limited thereto.

[Write Method]

A write method to the non-volatile semiconductor memory device according to the third embodiment will be explained using FIG. 15 to FIG. 21.

In the third embodiment, since the drain side selection gate SGD and the source side selection gate SGS are configured integrally, the same voltage is applied to the drain side selection gate SGD and the source side selection gate SGS. With the operation, a write operation becomes inadequate.

To cope with the inadequate write operation, in the third embodiment, a write operation to the write target memory cell transistors MTr is performed by the following procedure.

(1) A preliminary write operation is performed to the memory cell transistors MTr in a selected NAND string 200, and a threshold value voltage is set to 0 V or more.

(2) A write operation is performed to the source side selection transistor SSTr in the selected NAND string 200, and the threshold value voltage is increased.

(3) After data is erased from the memory cell transistors MTr, data is written to the write target memory cell transistors MTr.

(4) Data is erased from the source side selection transistor SSTr, and the threshold value voltage is lowered (restored to the original value).

Steps (1)-(4) will be explained in detail.

(1) Preliminary Write Step to Memory Cell Transistors MTr

Figure 15:
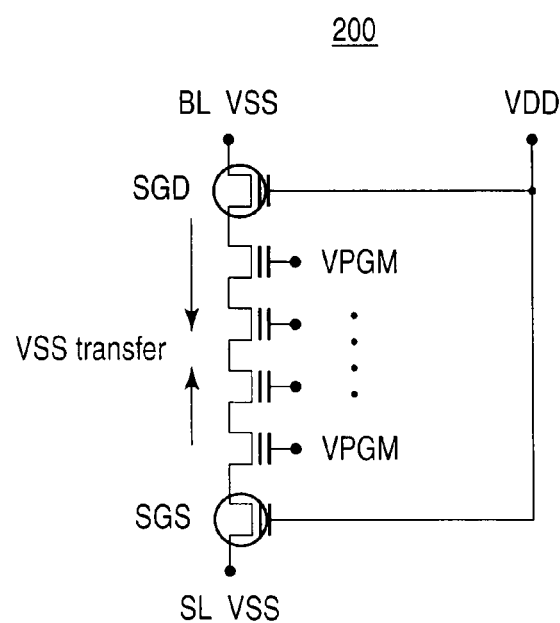
FIG. 15 is a circuit diagram showing a NAND string according to a third embodiment.

FIG. 15 shows a circuit diagram when the preliminary write operation is performed to the memory cell transistors MTr in the NAND strings 200 according to the third embodiment.

As shown in FIG. 15, in the preliminary write operation to the memory cell transistors MTr in the NAND strings 200, the voltage VSS is applied to a bit line BL and a source line SL, and the voltage VDD is applied to the source side selection gate SGS and the drain side selection gate SGD. Further, although not shown, the conduction voltage is applied to a back gate BG. With the operation, the source side selection gate SGS and the drain side selection gate SGD are turned on, and the voltage VSS is transferred to a channel. In the state, the write voltage VPGM is applied to a word line WL, the preliminary write operation is performed to the memory cell transistors MTr. The preliminary write operation is collectively performed to all the NAND strings 200 in blocks.

Note that the preliminary write operation is preferably performed to all the memory cell transistors MTr in the NAND strings 200. With the operation, at step (2) to be described later, the memory cell transistors MTr are liable to be cut off.

FIG. 16 shows a timing chart of the voltage values applied when the preliminary write operation is perform to the memory cell transistors MTr in the selected NAND string 200.

As shown in FIG. 16, at a time t0, the preliminary write operation is started to the memory cell transistors MTr. First, at the time t0, the voltage VSS is applied to the source line SL, the bit line BL, the word line WL, and the selection gate SG (drain side selection gate SGD and source side selection gate SGS).

Next, at a time t1, the voltage VDD is applied to the selection gate SG. At the same time, the voltage VDD is applied to the word line WL.

Next, at a time t2, the write pass voltage the voltage VPASS is applied to the word line WL, and the voltage VSS is transferred to the channel. Thereafter, at a time t3, the write voltage VPGM is applied to the word line WL. As described above, the write operation is performed to the memory cell transistors MTr connected to the word line WL. With the operation, the threshold value voltage of the memory cell transistors MTr is set to a positive voltage (0 V or more), and it becomes possible to perform the write operation to the source side selection transistor SSTr at step (2).

Thereafter, at a time t4, the voltage VSS is applied to the word line WL and the selection gate SG, and the preliminary write operation to the memory cell transistors MTr is finished.

Note that, although the voltages applied to the respective nodes are increased stepwise at the times t1, t2, and t3, the voltages may be increased at the same time at the time t1.

(2) Write Step to Source Side Selection Transistor SSTr

FIG. 17 shows a circuit diagram when the write operation is performed to the source side selection transistor SSTr in the NAND string 200 according to the third embodiment.

As shown in FIG. 17, in a write operation to the source side selection transistor SSTr in a selected NAND string 200, a voltage [VPGM-VPASS] is applied to a bit line BL, and the voltage VSS is applied to the source line SL. Further, the write voltage VPGM is applied to the source side selection gate SGS and the drain side selection gate SGD. At the time, the voltage VSS is applied to the word line WL.

The memory cell transistors MTr connected to the word line WL have the threshold value voltage of a negative voltage in an initial state. Therefore, in the initial state, when the voltage VSS (for example, 0 V) is applied to the word line WL, since the memory cell transistors MTr become turned on, the voltage [VPGM-VPASS] applied to the bit line BL is transferred to the channel. As a result, the write operation cannot be performed to the source side selection transistor SSTr.

However, at step (1), the preliminary write operation is performed to the memory cell transistors MTr, and the threshold value voltage is made to the positive voltage. Therefore, even if the voltage VSS (for example, 0 V) is applied to the word line WL, the memory cell transistors MTr can be cut off. With the operation, the write operation can be performed only to the source side selection transistor SSTr.

As described above, the threshold value voltage of the source side selection transistor SSTr can be made higher than the threshold value voltage of the drain side selection transistor SDTr by performing the write operation only to the source side selection transistor SSTr in the two selection transistors.

Figure 18:
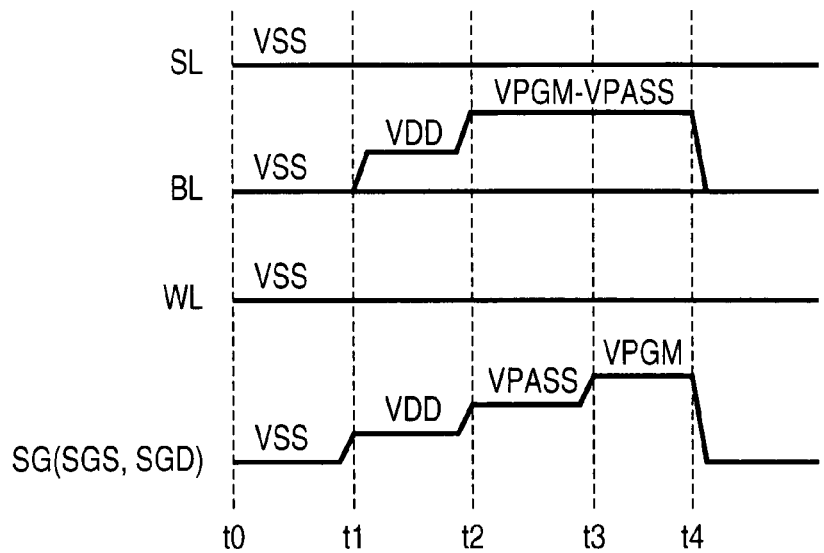
FIG. 18 is a timing chart showing voltage values when a write operation is performed to a NAND string according to the third embodiment.

FIG. 18 shows a timing chart of the voltage values applied when the write operation is performed to the source side selection transistor SSTr in the selected NAND string 200.

As shown in FIG. 18, at a time t0, the write operation is started to the source side selection transistor SSTr. First, at the time t0, the voltage VSS is applied to the source line SL, the bit line BL, the word line WL, and the selection gate SG (drain side selection gate SGD and source side selection gate SGS).

Next, at a time t1, the voltage VDD is applied to the selection gate SG. At the same time, the voltage VDD is applied to the bit line BL connected to the selected NAND string 200.

Next, at a time t2, the write pass voltage VPASS is applied to the selection gate SG, and the voltage [VPGM-VPASS] is applied to the bit line BL connected to the selected NAND string 200. Thereafter, at a time t3, the write voltage VPGM is applied to the selection gate SG. As described above, the write operation is performed only to the source side selection transistor SSTr in the two selection transistors. With the operation, it becomes possible to perform the write operation to the write target memory cell transistors MTr at step (3) by making the threshold value voltage of the source side selection transistor SSTr higher than the threshold value voltage of the drain side selection transistor SDTr.

Thereafter, at a time t4, the voltage VSS is applied to the bit line BL and the selection gate SG connected to the selected NAND string 200, and the write operation to the source side selection transistor SSTr is finished.

Note that, although the voltages applied to the respective nodes are increased stepwise at the times t1, t2, and t3, the voltages may be increased at the same time at the time t1.

(3) Step of Writing Data to Write Target Memory Cell Transistors MTr

First, data of the memory cell transistors MTr, to which the preliminary write operation is performed, is erased by a known method. More specifically, the voltage VSS is applied to the bit line BL, and an erase voltage VERA is applied to the source line SL. Further, the selection gate SG is floated, and the voltage VSS is applied to the word line WL. With the operation, the data of the memory cell transistors MTr, to which the preliminary write operation is performed, is erased.

Thereafter, as shown in FIG. 6A, data is written to the write target memory cell transistors MTr by the same method as the first embodiment. More specifically, the voltage VSS is applied to the bit line BL, and the voltage VDD is applied to the source line SL. Further, the voltage VDD is applied to the selection gate SG, and the voltage VPGM is applied to the word line WL connected to the write target memory cell transistors MTr.

At the time, at step (2), since data is written to source side selection transistor SSTr (electrons are accumulated in a charge accumulation layer 321), the threshold value voltage of the source side selection transistor SSTr is equal to or higher than the voltage VDD. In the selected NAND string 200, even if the same voltage VDD is applied to the source side selection gate SGS and the drain side selection gate SGD, it is possible to turn off the source side selection gate SGS and to turn on only the drain side selection gate SGD. Accordingly, in a structure in which the source side selection gate SGS and the drain side selection gate SGD are configured integrally, the write operation can be ordinarily performed to the write target memory cell transistors MTr.

(4) Erase Step to Source Side Selection Transistor SSTr

Figure 19:
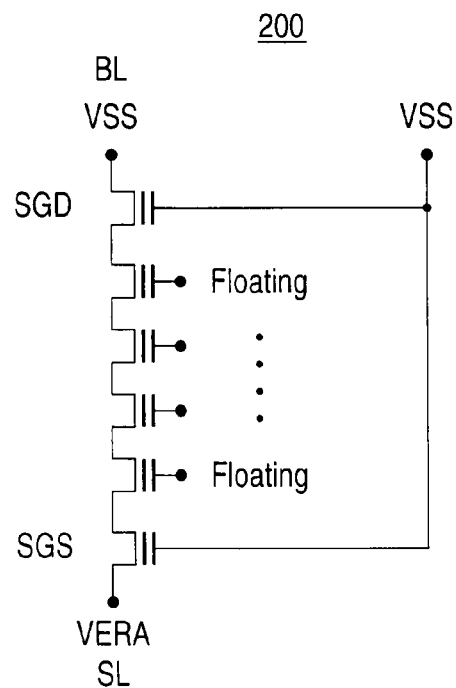
FIG. 19 is a circuit diagram showing a NAND string according to the third embodiment.

FIG. 19 shows an example of a circuit diagram when data is erased from the source side selection transistor SSTr in the NAND string 200 according to the third embodiment.

As shown in FIG. 19, when data is erased from the source side selection transistor SSTr in the selected NAND string 200, the voltage VSS is applied to the bit line BL, and the erase voltage VERA is applied to the source line SL. Further, the word line WL is floated, and the voltage VSS is applied to the selection gate SG. Further, although not shown, the back gate BG is also floated. With the operation, the data of the source side selection transistor SSTr to which data is written is erased.

Note that, although the erase method described above may be used, there is a possibility that a body potential does not increase up to the voltage VERA because holes flow from the source line SL to the bit line BL. Accordingly, the following erase method may be employed in consideration that data of the source side selection transistor SSTr is not sufficiently erased.

First, after data has been written to the memory cell transistors MTr at step (3), the write operation is performed to the drain side selection transistor SDTr by the same method as the source side selection transistor SSTr. With the operation, the threshold value voltage of the source side selection transistor SSTr and the threshold value voltage of the drain side selection transistor SDTr become the same threshold value voltage.

Figure 20:
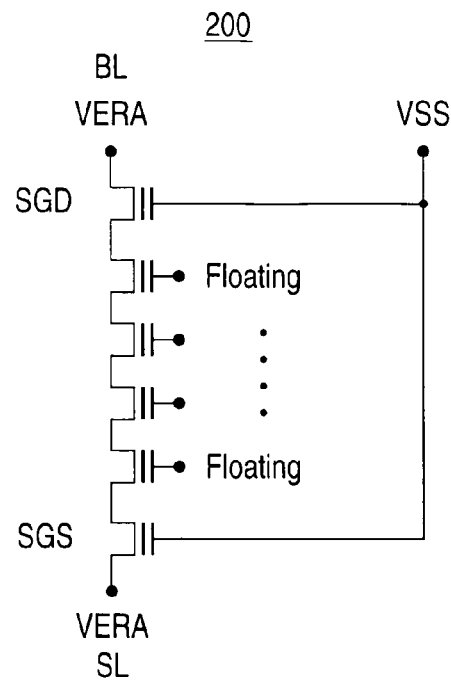
FIG. 20 is a circuit diagram showing a NAND string according to the third embodiment.

Next, as shown in FIG. 20, data of the source side selection transistor SSTr and data of the drain side selection transistor SDTr in the selected NAND string 200 are erased at the same time. More specifically, the erase voltage VERA is applied to the bit line BL and the source line SL. Further, the word line WL is floated, and the voltage VSS is applied to the selection gate SG. Further, although not shown, the back gate BG is also floated. With the operation, data of the written source side selection transistor SSTr and data of the drain side selection transistor SDTr, to each of which data is written, are erased. Since the body potential can be increased up to the voltage VERA by applying the voltage VERA also to the bit lines BL, the data of the source side selection transistor SSTr can be sufficiently erased.

Figure 21:
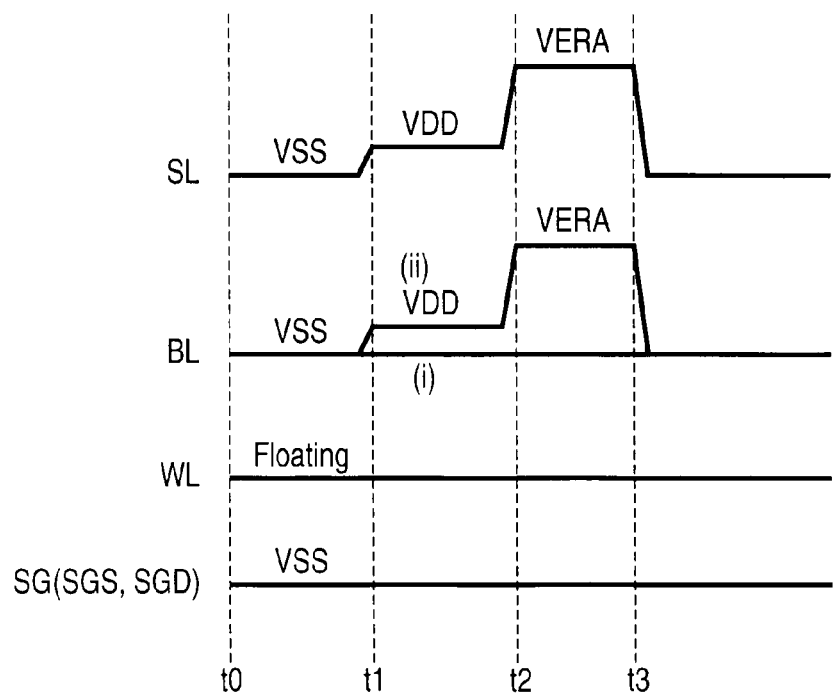
FIG. 21 is a timing chart showing voltage values when a write operation is performed to a NAND string according to the third embodiment.

FIG. 21 shows a timing chart of the voltage values applied when data of the source side selection transistor SSTr in the selected NAND string 200 is erased.

As shown in FIG. 21, at a time t0, an erase operation is started to the source side selection transistor SSTr. First, at the time t0, the voltage VSS is applied to the source line SL, the bit line BL, and the selection gate SG, and the word line WL is floated.

Next, at a time t1, the voltage VDD is applied to the source line SL. At the time, (i) as shown in FIG. 19, when only the data of the source side selection transistor SSTr are erased, the voltage VSS remains applied to the bit line BL. In contrast, (ii) as shown in FIG. 20, when the data of the source side selection transistor SSTr and the data of the drain side selection transistor SDTr are erased at the same time, the voltage VDD is applied to the bit line BL.

Next, at a time t2, the voltage VERA is applied to the source line SL. Further, in the case of (i), the voltage VSS remains applied to the bit line BL, whereas, in the case of (ii), the voltage VERA is applied to the bit line BL. As described above, the data of the source side selection transistor SSTr (and the data of the drain side selection transistor SDTr) are erased.

Thereafter, at a time t4, the voltage VSS is applied to the source line SL (and the bit line BL), and the erase operation to the source side selection transistor SSTr (and the drain side selection transistor SDTr) is finished.

[Effect]

According to the third embodiment, the same effect as the first embodiment can be obtained.

Further, in the third embodiment, write to the source side selection transistor SSTr is performed before write to the write target memory cell transistors MTr is performed. With the operation, the threshold value voltage of the source side selection transistor SSTr is made higher than the threshold value voltage of the drain side selection transistor SDTr. As a result, in the NAND string 200, an inadequate write caused by integrally configuring the drain side selection gate SGD and the source side selection gate SGS can be overcome.

Further, in the third embodiment, a difference between the threshold value voltage of the source side selection transistor SSTr and the threshold value voltage of the drain side selection transistor SDTr becomes larger in comparison with the ion implantation method in the first embodiment. As a result, the on/off characteristics of the source side selection gate can be improved in comparison with the first embodiment.

[Modification 1]

A write method to a non-volatile semiconductor memory device 1 according to modifications of the third embodiment will be explained using FIG. 22 and FIG. 23. A modification 1 is an example in which the write operation is performed only to the source side selection transistor SSTr at step (2) of the write method in the third embodiment by cutting off dummy memory cell transistors (dummy word line).

Note that, in the modification 1, the explanation of the same point as the third embodiment is omitted, and a different point will be explained.

FIG. 22 shows a circuit diagram when the write operation is performed to a source side selection transistor SSTr in a NAND string 200 according to the modification 1 of the third embodiment.

As shown in FIG. 22, the modification 1 is different from the third embodiment in that a word line adjacent to a drain side selection gate SGD and a source side selection gate SGS functions as a drain side dummy word line D-WL-D and a source side dummy word line D-WL-S, respectively.

More specifically, at step (2), the voltage [VPGM-VPASS] is applied to a bit line BL, and the voltage VSS is applied to a source line SL. Further, the write voltage VPGM is applied to the source side selection gate SGS and the drain side selection gate SGD.

At the time, the voltage VSS is applied to the source side dummy word line D-WL-S and the word line WL, and a voltage VOFF is applied to the drain side dummy word line D-WL-D. The voltage VOFF is a negative voltage having a value smaller than the threshold value voltage of the drain side dummy word line D-WL-D. Therefore, the dummy memory cell transistors MTr connected to the drain side dummy word line D-WL-D can be cut off. As a result, the write operation can be performed only to the source side selection transistor SSTr.

As described above, the threshold value voltage of the source side selection transistor SSTr can be made higher than the threshold value voltage of a drain side selection transistor SDTr by performing the write operation only to the source side selection transistor SSTr in the two selection transistors.

FIG. 23 shows a timing chart of the voltage values applied when the write operation is performed to the source side selection transistor SSTr in a selected NAND string 200 in the modification 1.

As shown in FIG. 23, at a time t0, the write operation is started to the source side selection transistor SSTr. First, at the time t0, the voltage VSS is applied to the source line SL, the bit line BL, the word line WL, the source side dummy word line D-WL-S, the drain side dummy word line D-WL-D, and the selection gates SG.

Next, at time t1, the voltage VDD is applied to the selection gate SG. At the same time, the voltage VDD is applied to the bit line BL connected to the selected NAND string 200. Further, the voltage VOFF which is smaller than the voltage VSS is applied to the drain side dummy word line D-WL-D.

Next, at a time t2, the write pass voltage VPASS is applied to the selection gate SG, and the voltage [VPGM-VPASS] is applied to the bit line BL connected to the selected NAND string 200. Thereafter, at a time t3, the write voltage VPGM is applied to the selection gate SG. As described above, the write operation is performed only to the source side selection transistor SSTr in the two selection transistors. With the operation, since the threshold value voltage of the source side selection transistor SSTr is made higher than the threshold value voltage of the drain side selection transistor SDTr, the write operation can be performed to the write target memory cell transistors MTr at step (3).

Thereafter, at a time t4, the voltage VSS is applied to the bit line BL, the drain side dummy word line D-WL-D, and the selection gate SG connected to the selected NAND string 200, and the write operation to the source side selection transistor SSTr is finished.

According to the modification 1, at step (2) of the third embodiment, the voltage VOFF is applied to the drain side dummy word line D-WL-D. With the operation, since the dummy memory cell transistors connected to the drain side dummy word line D-WL-D can be cut off, the write operation can be performed only to the source side selection transistor SSTr. Accordingly, step (1) in the third embodiment becomes unnecessary. At the same time, data of the memory cell transistors MTr, to which the preliminary write operation is performed at step (3) in the third embodiment, need not be erased. As a result, a write speed can be improved in comparison with the third embodiment.

[Modification 2]

A write method of a non-volatile semiconductor memory device according to a modification 2 of the third embodiment will be explained using FIG. 24 and FIG. 27. The modification 2 is an example in which, the write operation is performed only to the source side selection transistor SSTr by performing the write operation only to the dummy memory cell transistors at step (1) of the write method in the third embodiment and cutting off the dummy memory cell transistors at step (2).

Note that, in the modification 2, the explanation of the same point as the third embodiment is omitted, and a different point will be explained.

Step (1)

Figure 24:
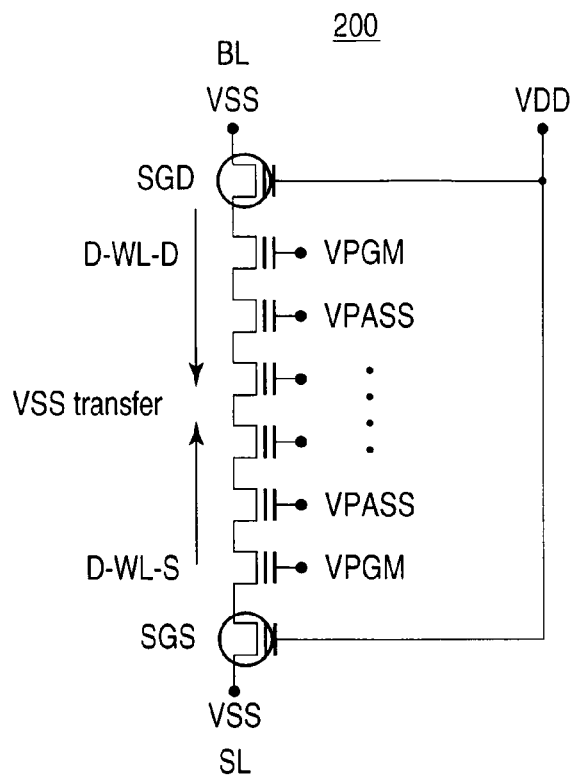
FIG. 24 is a circuit diagram showing a NAND string according to a modification 2 of the third embodiment.

FIG. 24 shows a circuit diagram in the write operation to dummy memory cell transistors in a NAND string 200 according to the modification 2 of the third embodiment.

As shown in FIG. 24, the modification 2 is different from the third embodiment in that a word line adjacent to a drain side selection gate SGD and a source side selection gate SGS functions as a drain side dummy word line D-WL-D and a source side dummy word line D-WL-S, respectively.

In the modification 2, at step (1), the write operation is performed only to the dummy memory cell transistors connected to the drain side dummy word line D-WL-D and the source side dummy word lines D-WL-S. More specifically, the voltage VSS is applied to a bit line BL and a source line SL, and the voltage VDD is applied to the source side selection gate SGS and the drain side selection gate SGD. Further, although not shown, the conduction voltage is applied to a back gate BG. With the operation, the source side selection gate SGS and the drain side selection gate SGD are turned on, and the voltage VSS is transferred to a channel. In the state, the voltage VPASS is applied to a word line WL, and the write voltage VPGM is applied to the drain side dummy word line D-WL-D and the source side dummy word lines D-WL-S. With the operation, the write operation is performed only to the dummy memory cell transistors.

Figure 25:
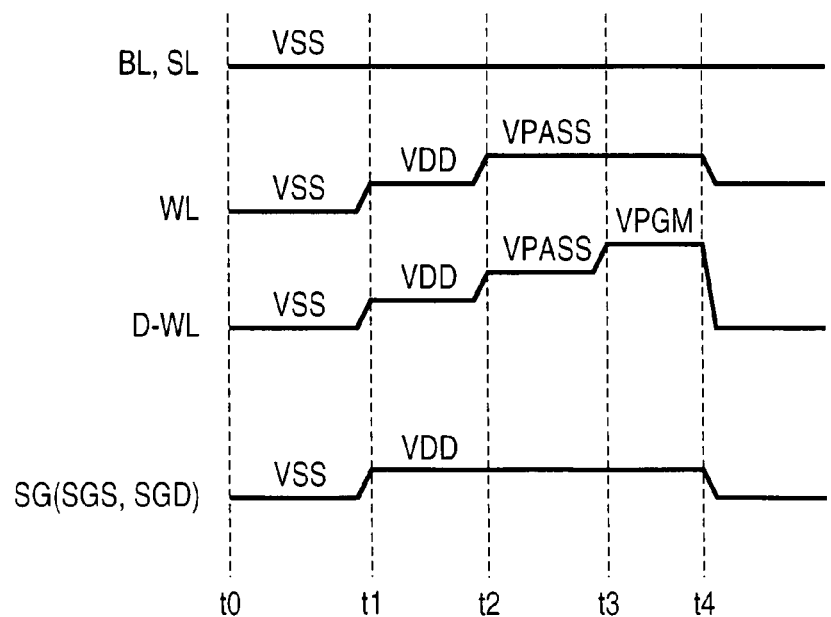
FIG. 25 is a timing chart showing voltage values when a write operation is performed to a NAND string according to the modification 2 of the third embodiment.

FIG. 25 shows a timing chart of the voltage values applied when the write operation is performed to the dummy memory cell transistors in a selected NAND string 200 in the modification 2.

As shown in FIG. 25, at a time t0, the write operation is started to the dummy memory cell transistors. First, at a time t0, the voltage VSS is applied to the source line SL, the bit line BL, the word line WL, the dummy word lines D-WL (drain side dummy word line D-WL-D and source side dummy word line D-WL-S), and the selection gates SG.

Next, at a time t1, the voltage VDD is applied to the selection gates SG. At the same time, the voltage VDD is applied to the word line WL and the dummy word lines D-WL.

Next, at a time t2, the write pass voltage VPASS is applied to the word line and the dummy word lines D-WL, and the voltage VSS is transferred to a channel. Thereafter, at a time t3, the write voltage VPGM is applied to the dummy word lines D-WL. As described above, the write operation is performed to the dummy memory cell transistors connected to the dummy word line D-WL. With the operation, since the threshold value voltage of the dummy memory cell transistors is set to a positive voltage (0 V or more), the write operation can be performed to the source side selection transistor SSTr at step (2).

Thereafter, at a time t4, the voltage VSS is applied to the word line WL, the dummy word lines D-WL, and the selection gate SG, and the write operation to the dummy memory cell transistors is finished.

Step (2)

Figure 26:
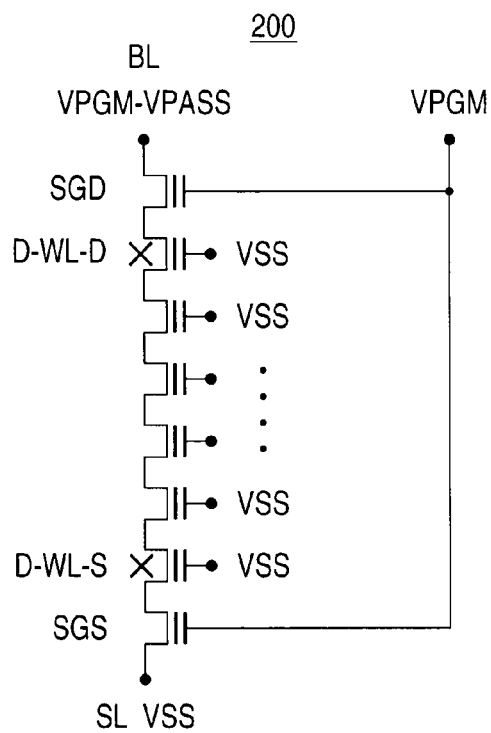
FIG. 26 is a circuit diagram showing a NAND string according to the modification 2 of the third embodiment.

FIG. 26 shows a circuit diagram when the write operation is performed to the source side selection transistor SSTr in the NAND string 200 according to the modification 2 of the third embodiment.

As shown in FIG. 26, at step (2), the voltage [VPGM-VPASS] is applied to the bit line BL, and the voltage VSS is applied to the source line SL. Further, the write voltage VPGM is applied to the source side selection gate SGS and the drain side selection gate SGD, and the voltage VSS is applied to the dummy word lines D-WL and the word line WL.

At the time, at step (1), the write operation is performed to the dummy memory cell transistors connected to the dummy word lines D-WL, and the threshold value voltage is set to the positive voltage. Therefore, even if the voltage VSS (for example, 0 V) is applied to the dummy word lines D-WL, the dummy memory cell transistors can be cut off. As a result, the write operation can be performed only to the source side selection transistor SSTr.

As described above, the threshold value voltage of the source side selection transistor SSTr can be made higher than the threshold value voltage of the drain side selection transistor SDTr by performing the write operation only to the source side selection transistor SSTr in the two selection transistors.

Figure 27:
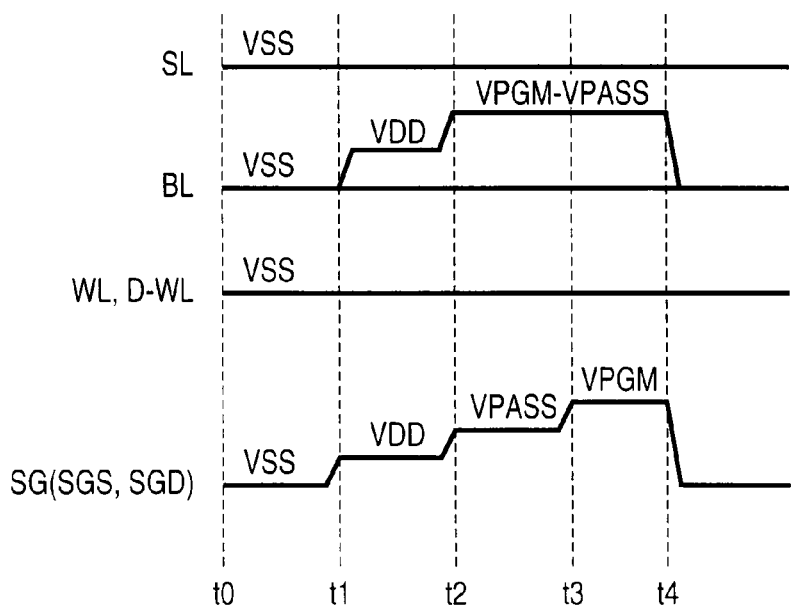
FIG. 27 is a timing chart showing voltage values when a write operation is performed to a NAND string according to the modification 2 of the third embodiment.

FIG. 27 shows a timing chart of the voltage values applied when the write operation is performed to the source side selection transistor SSTr in the selected NAND string 200 in the modification 2.

As shown in FIG. 27, at a time t0, the write operation is started to the dummy memory cell transistors SSTr. First, at the time t0, the voltage VSS is applied to the source line SL, the bit line BL, the word line WL, the dummy word lines D-WL, and the selection gate SG.

Next, at a time t1, the voltage VDD is applied to the selection gate SG. At the same time, the voltage VDD is applied to the bit line BL connected to a selected NAND string 200.

Next, at a time t2, the write pass voltage VPASS is applied to the selection gate SG, and the voltage [VPGM-VPASS] is applied to the bit line BL connected to the selected NAND string 200. Thereafter, at a time t3, the write voltage VPGM is applied to the selection gate SG. As described above, the write operation is performed only to the source side selection transistor SSTr in the two selection transistors. With the operation, since the threshold value voltage of the source side selection transistor SSTr is made higher than the threshold value voltage of the drain side selection transistor SDTr, the write operation can be performed to write target memory cell transistors MTr at step (3).

Thereafter, at a time t4, the voltage VSS is applied to the bit line BL connected to the selected NAND string, and to the selection gate SG, and the write operation to the source side selection transistor SSTr is finished.

According to the modification 2, the write operation is performed only to the dummy memory cell transistors at step (1) in the third embodiment. With the operation, at step (2) in the third embodiment, the dummy memory cell transistors can be cut off, and the write operation can be performed only to the source side selection transistor SSTr. The dummy memory cell transistors are not used as ordinary memory cell transistors MTr. Therefore, data of the dummy memory cell transistors need not be erased at step (3) in the third embodiment. As a result, the write speed can improved in comparison with the third embodiment.

[Modification 3]

A write method to a non-volatile semiconductor memory device according to a modification 3 of the third embodiment will be explained using FIG. 28 and FIG. 29. The modification 3 is an example in which the write operation is performed only to a source side selection transistor SSTr by cutting off a back gate transistor (back gate) at step (2) of the write method in the third embodiment.

Note that, in the modification 3, the explanation of the same point as the third embodiment is omitted, and a different point will be explained.

Figure 28:
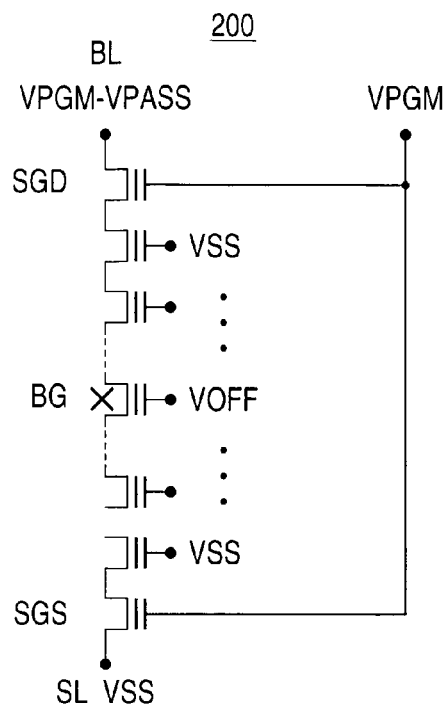
FIG. 28 is a circuit diagram showing a NAND string according to a modification 3 of the third embodiment.

FIG. 28 shows a circuit diagram when the write operation is performed to the source side selection transistor SSTr in a NAND string 200 according to the modification 3 of the third embodiment.

As shown in FIG. 28, the modification 3 is different from the third embodiment in that, at step (2), the write operation is performed to the source side selection transistor SSTr by cutting off the back gate transistor BGTr.

More specifically, at step (2), the voltage [VPGM-VPASS] is applied to a bit line BL, and the voltage VSS is applied to a source line SL. Further, the write voltage VPGM is applied to a source side selection gate SGS and a drain side selection gate SGD.

At the time, the voltage VSS is applied to a word line WL, and the voltage VOFF is applied to the back gate BG. The voltage VOFF is a negative voltage having a value smaller than the threshold value voltage of the back gate BG. Therefore, the back gate transistor BGTr can be cut off. With the operation, the write operation can be performed only to the source side selection transistor SSTr.

As described above, the threshold value voltage of the source side selection transistor SSTr can be made higher than the threshold value voltage of the drain side selection transistor SDTr by performing the write operation only to the source side selection transistor SSTr in the two selection transistors.

Figure 29:
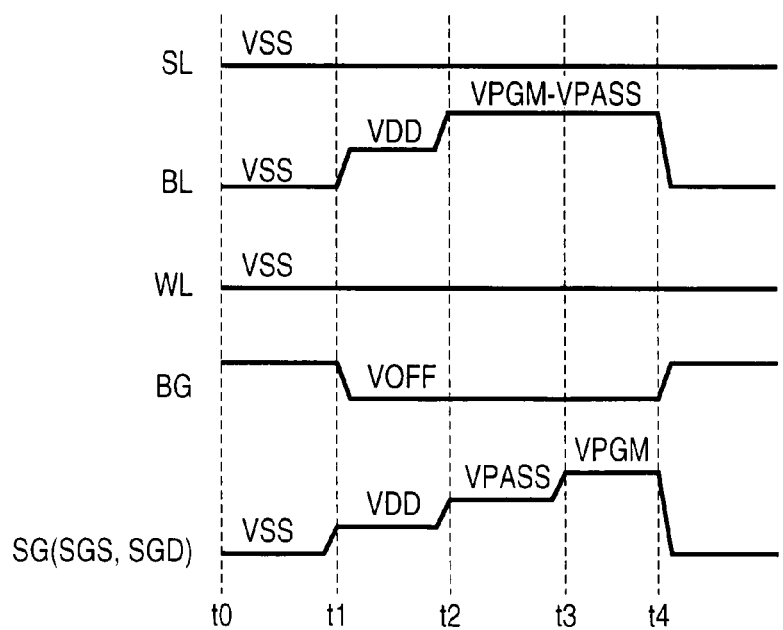
FIG. 29 is a timing chart showing voltage values when a write operation is performed to a NAND string according to the modification 3 of the third embodiment.

FIG. 29 shows a timing chart of the voltage values applied when the write operation is performed to the source side selection transistor SSTr in a selected NAND string 200 in the modification 3.

As shown in FIG. 29, at a time t0, the write operation is started to the source side selection transistor SSTr. First, at the time t0, the voltage VSS is applied to the source line SL, the bit line BL, the word line WL, the back gate BG, and a selection gate SG.

Next, at a time t1, the voltage VDD is applied to the selection gate SG. At the same time, the voltage VDD is applied to the bit line BL connected to a selected NAND string 200. Further, the voltage VOFF smaller than the voltage VSS is applied to the back gate BG.

Next, at a time t2, the write pass voltage VPASS is applied to the selection gate SG, and the voltage [VPGM-VPASS] is applied to the bit line BL connected to the selected NAND string 200. Thereafter, at a time t3, the write voltage VPGM is applied to the selection gate SG. As described above, the write operation is performed only to the source side selection transistor SSTr in the two selection transistors. With the operation, since the threshold value voltage of the source side selection transistor SSTr is made higher than the threshold value voltage of the drain side selection transistor SDTr, the write operation can be performed to write target memory cell transistors MTr at step (3).

Thereafter, at a time t4, the voltage VSS is applied to the bit line BL connected to the selected NAND string 200, the back gate BG, and the selection gate SG, and the write operation to the source side selection transistor SSTr is finished.

According to the modification 3, the voltage VOFF is applied to the back gate BG at step (2) in the third embodiment. With the operation, the back gate transistor BGTr can be cut off, and the write operation can be performed only to the source side selection transistor SSTr. Accordingly, step (1) in the third embodiment becomes unnecessary. At the same time, data of the memory cell transistors MTr, to which the preliminary write operation is performed at step (3) in the third embodiment, need not be erased. As a result, the write speed can improved in comparison with the third embodiment.

[Modification 4]

A write method to a non-volatile semiconductor memory device according to a modification 4 of the third embodiment will be explained using FIG. 30 and FIG. 33. The modification 4 is an example in which the write operation is performed only to the back gate transistor at step (1) of the write method in the third embodiment, and the write operation is performed only to the source side selection transistors SSTr by cutting off the back gate transistor at step (2).

Note that, in the modification 4, the explanation of the same point as the third embodiment is omitted, and a different point will be explained.

Step (1)

Figure 30:
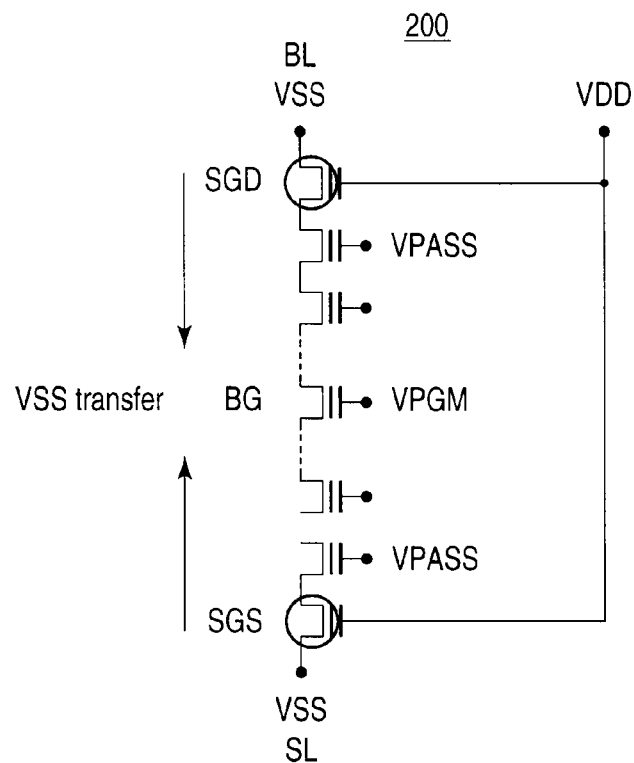
FIG. 30 is a circuit diagram showing a NAND string according to a modification 4 of the third embodiment.

FIG. 30 shows a circuit diagram when the write operation is performed to a back gate transistor BGTr in a NAND string 200 according to the modification 4 of the third embodiment.

As shown in FIG. 30, the modification 4 is different from the third embodiment in that, at step (1), the write operation is performed only to the back gate transistor BGTr.

More specifically, at step (1), the voltage VSS is applied to a bit line BL and a source line SL, and the voltage VDD is applied to a source side selection gate SGS and a drain side selection gate SGD. With the operation, the source side selection gate SGS and the drain side selection gate SGD are turned on, and the voltage VSS is transferred to a channel. In the state, the voltage VPASS is applied to a word line WL, and the write voltage VPGM is applied to a back gate BG. With the operation, the write operation is performed only to the back gate transistor BGTr.

Figure 31:
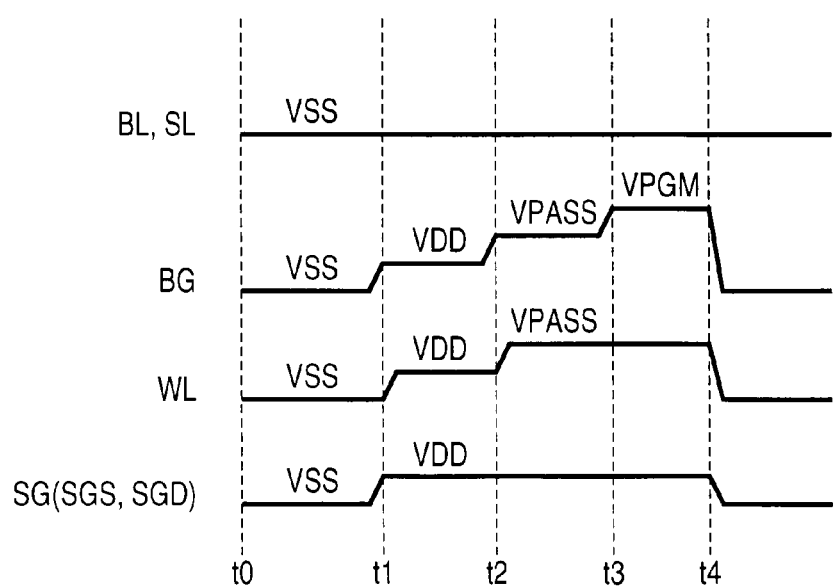
FIG. 31 is a timing chart showing voltage values when a write operation is performed to a NAND string according to the modification 4 of the third embodiment.

FIG. 31 shows a timing chart of the voltage values applied when the write operation is performed to the back gate transistor BGTr in a selected NAND string 200 in the modification 4.

As shown in FIG. 31, at a time t0, the write operation is started to the back gate transistor BGTr. First, at the time t0, the voltage VSS is applied to the source line SL, the bit line BL, the word line WL, the back gate BG, and a selection gate SG.

Next, at a time t1, the voltage VDD is applied to the selection gate SG. At the same time, the voltage VDD is applied to the word line WL and the back gate BG.

Next, at a time t2, the write pass voltage VPASS is applied to the word line and the back gate BG, and the voltage VSS is transferred to the channel. Thereafter, at a time t3, the write voltage VPGM is applied to the back gate BG. As described above, the write operation is performed to the back gate transistor BGTr. With the operation, since the threshold value voltage of the back gate transistor BGTr is set to the positive voltage (0 V or more), the write operation can be performed to the source side selection transistor SSTr at step (2).

Thereafter, at a time t4, the voltage VSS is applied to the word line WL, the back gate BG, and the selection gate SG, and the write operation to the back gate transistor BGTr is finished.

Step (2)

Figure 32:
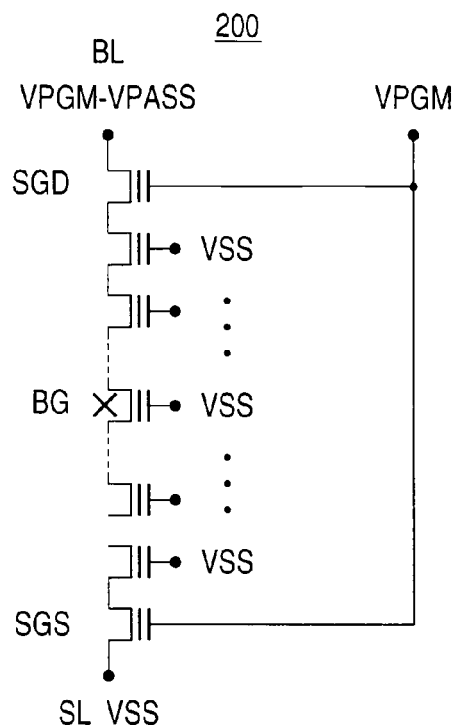
FIG. 32 is a circuit diagram showing a NAND string according to the modification 4 of the third embodiment.

FIG. 32 shows a circuit diagram when the write operation is performed to the source side selection transistor SSTr in the NAND string 200 according to the modification 4 of the third embodiment.

As shown in FIG. 32, the modification 4 is different from the third embodiment in that, at step (2), the back gate transistor BGTr is cut off.

More specifically, at step (2), the voltage [VPGM-VPASS] is applied to the bit line BL, and the voltage VSS is applied to the source line SL. Further, the write voltage VPGM is applied to the source side selection gate SGS and the drain side selection gate SGD, and the voltage VSS is applied to the back gate BG and the word line WL.

At the time, at step (1), the write operation is performed to the back gate transistor BGTr, and a threshold value voltage is set to the positive voltage. Therefore, even if the voltage VSS (for example, 0 V) is applied to the back gate BG, the back gate transistor BGTr can be cut off. With the operation, the write operation can be performed only to the source side selection transistor SSTr.

As described above, since the write operation is performed only to the source side selection transistor SSTr in the two selection transistors, the threshold value voltage of the source side selection transistor SSTr can be made higher than the threshold value voltage of the drain side selection transistor SDTr.

Figure 33:
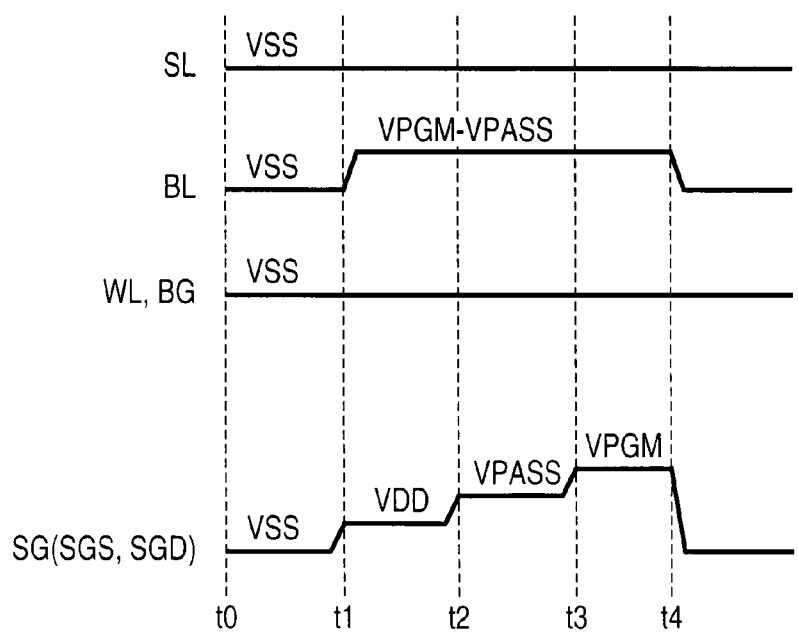
FIG. 33 is a timing chart showing voltage values when a write operation is performed to a NAND string according to the modification 4 of the third embodiment.

FIG. 33 shows a timing chart of the voltage values applied when the write operation is performed to the source side selection transistors SSTr in the selected NAND string 200 in the modification 4.

As shown in FIG. 33, at a time t0, the write operation is started to the source side selection transistor SSTr. First, at the time t0, the voltage VSS is applied to the source line SL, the bit line BL, the word line WL, the back gate BG, and the selection gate SG.

Next, at a time t1, the voltage VDD is applied to the selection gate SG. Further, the voltage [VPGM-VPASS] is applied to the bit line BL connected to the selected NAND string 200.

Next, at a time t2, the write pass voltage VPASS is applied to the selection gate SG, and thereafter, at a time t3, the write voltage VPGM is applied the selection gate SG. As described above, the write operation is performed only to the source side selection transistor SSTr in the two selection transistors. With the operation, since the threshold value voltage of the source side selection transistor SSTr is made higher than the threshold value voltage of the drain side selection transistor SDTr, the write operation can be performed to write target memory cell transistors MTr at step (3).

Thereafter, at a time t4, the voltage VSS is applied to the bit line BL connected to the selected NAND string 200, and to the selection gate SG, and the write operation to the source side selection transistors SSTr is finished.

According to the modification 4, the write operation is performed only to the back gate transistor BGTr at step (1) of the third embodiment. With the operation, at step (2) in the third embodiment, since the back gate transistor BGTr can be cut off, the write operation can be performed only to the source side selection transistor SSTr. The back gate transistor BGTr is not used as an ordinary memory cell transistor MTr. Therefore, at step (3) in the third embodiment, data of the back gate transistor BGTr need not be erased. As a result, the write speed can improved in comparison with the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    memory strings disposed in matrix state; and
    a control circuit for controlling a voltage applied to the memory strings, wherein each memory string comprises:
    a semiconductor layer comprising a pair of pillar portions, which extend in a vertical direction to a substrate and are disposed in a column direction, and a coupling portion formed to couple lower ends of the pair of pillar portions;
    control gates which orthogonally intersect one of the pair of pillar portions or the other of the pair of pillar portions, extend in a row direction, and are laminated above the substrate in a vertical direction to the substrate;
    a first selection gate which orthogonally intersects one of the pair of pillar portions, extends in the row direction, and is formed above the control gates;
    a second selection gate which orthogonally intersects the other of the pair of pillar portions, extends in the row direction, is formed above the control gates, and is on the same level as the first selection gate as well as integrated with the first selection gate;
    memory cell transistors which are formed in the respective intersecting portions of the one of the pair of pillar portions or the other of the pair of pillar portions and the control gates and to which current paths are connected in series;
    a first selection transistor which is formed to the intersecting portion of one of the pair of pillar portions and the first selection gate, one end of the first selection transistor is connected to one end of the memory cell transistors, and the other end of the first selection transistor is connected to a source line; and
    a second selection transistor which is formed to the intersecting portion of the other of the pair of pillar portions and the second selection gate, one end of the second selection transistor is connected to the other end of the memory cell transistors, and the other end of the second selection transistor is connected to a bit line,
    the control circuit makes the threshold value voltage of the first selection transistor higher than the threshold value voltage of the second selection transistor by performing write to the first selection transistor before write to a write target memory cell transistor in the memory cell transistors is performed.

2. The device of claim 1, wherein, in the write operation to the write target memory cell transistor, the control circuit applies a first voltage, which turns off the first selection transistor to which write is performed and turns on the second selection transistor, to the first selection gate and the second selection gate and applies a write voltage to a control gate of the write target memory cell transistor in the control gates.

3. The device of claim 2, wherein, after write to the write target memory cell transistor, erase of the first selection transistor to which write is performed is performed.

4. The device of claim 3, wherein, before erase of the first selection transistor to which write is performed, the threshold value voltage of the second selection transistor is made approximately as large as the threshold value voltage of the first selection transistor to which write is performed by performing write to the second selection transistor, and then erases of the first selection transistor to which write is performed and the second selection transistor to which write is performed are performed.

5. The device of claim 1, wherein
    the control circuit makes the threshold value voltages of the memory cell transistors to a positive voltage by performing preliminary write to the memory cell transistors before write to the first selection transistor is performed, and
    in write operation to the first selection transistor, the control circuit applies a write voltage to the first selection gate and the second selection gate, applies a first voltage, by which write to the second selection transistor is not performed, to the bit line, applies a second voltage, by which write to the first selection transistor is performed, to the source line, and applies a third voltage, which turns off the memory cell transistors to which preliminary write is performed, to the control gates of the memory cell transistors to which preliminary write is performed in the control gates.

6. The device of claim 5, wherein preliminary write to the memory cell transistors is performed collectively with respect to the memory strings.

7. The device of claim 1, wherein
    in the memory cell transistors, the memory cell transistors connected to the second selection transistor are dummy memory cell transistors, and
    in write to the first selection transistor, the control circuit applies a write voltage to the first selection gate and the second selection gate, applies a first voltage, by which write to the second selection transistor is not performed, to the bit line, applies a second voltage, by which write to the first selection transistor is performed, to the source line, and applies a third voltage, which turns off the dummy memory cell transistors, to the control gates of the dummy memory cell transistors in the control gates.

8. The device of claim 1, wherein
    in the memory cell transistors, the memory cell transistor connected to the first selection transistor is first dummy memory cell transistors, and in the memory cell transistors, the memory cell transistor connected to the second selection transistor is second dummy memory cell transistor,
    the control circuit makes the threshold value voltages of the first dummy memory cell transistor and the second dummy memory cell transistor to a positive voltage by performing write to the first dummy memory cell transistor and the second dummy memory cell transistor before write to the first selection transistor is performed, and
    in write to the first selection transistor, the control circuit applies a write voltage to the first selection gate and the second selection gate, applies a first voltage, by which write to the second selection transistor is not performed, to the bit line, applies a second voltage, by which write to the first selection transistor is performed, to the source line, and applies a third voltage, which turns off the first dummy memory cell transistor and the second dummy memory cell transistor, to each of which write is performed, to the control gates of the first dummy memory cell transistor and the second dummy memory cell transistor to which write is performed, in the control gates.

9. The device of claim 1, wherein
the coupling portion is formed in a back gate which is formed below the control gates and expands in the column direction and the row direction,
a back gate transistor includes the coupling portion and the back gate, and
in write to the first selection transistor, the control circuit applies a write voltage to the first selection gate and the second selection gate, applies a first voltage, by which write to the second selection transistor is performed, to the bit line, applies a second voltage, by which write to the first selection transistor is performed, to the source line, and applies a third voltage, which turns off the back gate transistor, to the back gate.

10. The device of claim 1, wherein
the coupling portion is formed in a back gate which is formed below the control gates and expands in the column direction and the row direction,
a back gate transistor includes the coupling portion and the back gate,
the control circuit makes the threshold value voltage of the back gate transistor to a positive voltage by performing write to the back gate transistor before write to the first selection transistor is performed, and
in write to the first selection transistor, the control circuit applies a write voltage to the first selection gate and the second selection gate, applies a first voltage, by which write to the second selection transistor is not performed, to the bit line, applies a second voltage, by which write to the first selection transistor is performed, to the source line, and applies a third voltage, which turns off the back gate transistor to which write is performed, to the back gate.

11. The device of claim 1, wherein, the impurity concentration of a channel region of the first selection transistor is larger than the impurity concentration of a channel region of the second selection transistor.

12. The device of claim 11, wherein, the impurity concentration of the channel region of the first selection transistor is about $1\times10^{15}$ cm$^{-2}$-$5\times10^{15}$ cm$^{-2}$, and the impurity concentration of the channel region of the second selection transistor is about $5\times10^{14}$ cm$^{-2}$.

13. The device of claim 1, wherein, the control circuit comprises a selection gate drive circuit which is connected to the first selection gate and the second selection gate and controls a voltage applied to the first selection gate and the second selection gate.

14. The device of claim 1, wherein, each of the memory cell transistors, the first selection transistor, and the second selection transistor has a MONOS structure.

* * * * *